United States Patent
Kaiki

(10) Patent No.: US 8,131,240 B2
(45) Date of Patent: Mar. 6, 2012

(54) DIGITAL DEMODULATING APPARATUS, DIGITAL RECEIVER, CONTROLLING METHOD OF THE APPARATUS, COMPUTER PROGRAM PRODUCT, AND RECORDING MEDIUM RECORDING THEREON THE PRODUCT

(75) Inventor: Nobuyoshi Kaiki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 374 days.

(21) Appl. No.: 12/475,944

(22) Filed: Jun. 1, 2009

(65) Prior Publication Data
US 2010/0020906 A1 Jan. 28, 2010

(30) Foreign Application Priority Data
Jul. 28, 2008 (JP) ................. 2008-193110

(51) Int. Cl.
*H04B 1/16* (2006.01)
(52) U.S. Cl. ................. 455/234.1; 455/339
(58) Field of Classification Search ............. 455/550.1, 455/574, 219, 234.1, 234.2, 245.1, 245.2, 455/254, 339, 340
See application file for complete search history.

(56) References Cited

U.S. PATENT DOCUMENTS

| | | | | |
|---|---|---|---|---|
| 5,394,476 A | * | 2/1995 | Rollins et al. | 455/219 |
| 5,630,220 A | * | 5/1997 | Yano | 455/234.1 |
| 6,032,031 A | * | 2/2000 | Takaki | 455/245.2 |
| 6,463,264 B1 | | 10/2002 | Obara | |
| 6,498,926 B1 | | 12/2002 | Ciccarelli et al. | |
| 7,729,675 B2 | * | 6/2010 | Krone | 455/234.1 |

FOREIGN PATENT DOCUMENTS

| | | |
|---|---|---|
| JP | 2000201089 A | 7/2000 |
| JP | 2001332985 A | 11/2001 |
| JP | 2001-526485 A | 12/2001 |
| JP | 2006229733 A | 8/2006 |
| WO | WO-99/30426 A1 | 6/1999 |

\* cited by examiner

*Primary Examiner* — Thanh Le
(74) *Attorney, Agent, or Firm* — Birch, Stewart, Kolasch & Birch, LLP

(57) ABSTRACT

A digital demodulating apparatus is provided. A tuning unit performs a tuning process on a received signal and the intensity of the received signal it changed by an intensity changing unit including a variable-gain circuit. A demodulator performs a demodulating process on the signal, whose intensity has been changed by the intensity changing unit, and a power changing unit changes the magnitude of power supplied to the circuit components. When the intensity changing unit changes the intensity of the received signal, a gain changing unit changes a gain of the variable-gain circuit by a predetermined amount substantially at the same time as the power changing unit changes the power supplied to the circuit components. The predetermined amount is arranged so that an overall gain of the circuit components remains unchanged before and after the power and gain are changed by the power changing unit and the gain changing unit.

11 Claims, 13 Drawing Sheets

DIGITAL DEMODULATING APPARATUS, DIGITAL RECEIVER, CONTROLLING METHOD OF THE APPARATUS, COMPUTER PROGRAM PRODUCT, AND RECORDING MEDIUM RECORDING THEREON THE PRODUCT

BACKGROUND OF THE INVENTION

1. Field of the Invention

The present invention relates to a digital demodulating apparatus, a digital receiver, a controlling method of the apparatus, a computer program product, and a recording medium recording thereon the product.

2. Description of the Related Art

In a digital demodulating apparatus including components such as a tuner and demodulator by which a tuning process and a demodulating process are carried out on a received signal, there are cases where the magnitude of a current supplied to a circuit component constituting the tuner or the like is changed.

Japanese Unexamined Patent Publication No. 2001-526485 relates to a receiver which measures a non-linear component in an output signal of a demodulator and controls a bias current of each amplifier stage based on the measurement result. According to this document, the power consumption of the entire receiver is made preferable by controlling a bias current to each circuit element in accordance with the magnitude of a non-linear component in an output signal from the demodulator.

When a supply current to a circuit component is changed, the gain of the circuit component may also be changed. When the gain of the circuit component is reduced, the signal intensity may not be sufficient to perform a demodulating process. On the other hand, when the gain of the circuit component is increased, the demodulating process may not be successfully conducted on account of signal distortion.

The above-described document recites an AGC (Automatic Gain Control) circuit for the purpose of keeping the intensity of a signal supplied to the demodulator to be a predetermined level. The AGC circuit measures the intensity of an output signal from the tuner or the demodulator. When the intensity of the output signal deviates from a predetermined level, the AGC circuit changes the gain of an amplifier or attenuator of the tuner or the like in such a way as to return the signal intensity to the predetermined level. However, since it takes some time to return the signal intensity to the original level by the AGC circuit, the demodulating process may become unachievable during that time.

SUMMARY OF THE INVENTION

An object of the present invention is to provide a digital demodulating apparatus and digital receiver which restrain an influence of a change in a gain caused by a change in a supply current, a control method thereof, a computer program product, and a recording medium storing the computer program product therein.

According to the present invention, a digital demodulating apparatus includes: plural circuit components constituting a tuning unit which performs a tuning process on a received signal and an intensity changing unit which changes the intensity of the received signal; a demodulator which performs a demodulating process on the signal which has been subjected to the tuning process by the tuning unit and whose intensity has been changed by the intensity changing unit; a power changing unit which changes the magnitude of power supplied to the circuit components; and a gain changing unit which changes a gain when the intensity changing unit changes the intensity of the received signal, wherein, the intensity changing unit includes a variable-gain circuit whose gain is variable, the gain changing unit changes the gain of the variable-gain circuit by a predetermined amount substantially at the same time as the power changing unit changes the power supplied to the circuit components, and the predetermined amount is arranged so that an overall gain of the circuit components is unchanged before and after changing the power and the gain by the power changing unit and the gain changing unit.

In addition to the above, according to the present invention, a method of controlling a digital demodulating apparatus which includes: plural circuit components constituting a tuning unit which performs a tuning process on a received signal and an intensity changing unit which changes the intensity of the received signal; a demodulator which performs a demodulating process on the signal which has been subjected to the tuning process by the tuning unit and whose intensity has been changed by the intensity changing unit; a power changing unit which changes the magnitude of power supplied to the circuit components; and a gain changing unit which changes a gain when the intensity changing unit changes the intensity of the received signal, the intensity changing unit including a variable-gain circuit whose gain is variable, includes the steps of: (i) changing the magnitude of the power supplied to the circuit components; and (ii) changing a gain when the intensity changing unit changes the intensity of the received signal, wherein, in the step (ii), substantially at the same time as the step (i), the gain of the variable-gain circuit is changed in such a way that an overall gain of the circuit components is unchanged before and after both of the steps (i) and (ii) are carried out.

In addition to the above, according to the present invention, a computer program product is used for a digital demodulating apparatus which includes: plural circuit components constituting a tuning unit which performs a tuning process on a received signal and an intensity changing unit which changes the intensity of the received signal; a demodulator which performs a demodulating process on the signal which has been subjected to the tuning process by the tuning unit and whose intensity has been changed by the intensity changing unit; a power changing unit which changes the magnitude of power supplied to the circuit components; and a gain changing unit which changes a gain when the intensity changing unit changes the intensity of the received signal, the intensity changing unit including a variable-gain circuit whose gain is variable, and the computer program product causes the digital demodulating apparatus to substantially simultaneously perform the steps of: (i) changing the magnitude of the power supplied to the circuit components; and (ii) changing a gain when the intensity changing unit changes the intensity of the received signal, in such a way that an overall gain of the circuit components is unchanged before and after both of the steps (i) and (ii) are carried out.

According to the present invention, the gain is changed substantially at the same time as the supplied power is changed, with the result that the overall gain is unchanged before and after the change. This nearly eradicates the influence of the gain change due to the supply power change.

It is noted that "variable-gain circuit" of the present invention encompasses not only a circuit amplifying a signal but also a circuit attenuating a signal. In other words, an example of the gain of the variable-gain circuit is not only an amplification factor but also an attenuation factor.

In addition to the above, the present invention is preferably arranged so that digital demodulating apparatus further includes a noise evaluation unit which evaluates an influence of a noise component on a desired component in a signal received by the demodulator, wherein, the power changing unit changes the magnitude of the power supplied to the circuit components, based on a result of evaluation by the noise evaluation unit. According to this arrangement, the power consumption can be suitably controlled because the magnitude of the supply power is changed in accordance with the influence of the noise component on the desired component.

In addition to the above, the present invention is preferably arranged so that the noise evaluation unit estimates how an influence of the noise component on the desired component in the signal received by the demodulator changes before and after the power changing unit changes the magnitude of the power supplied to the circuit components, and the power changing unit changes the magnitude of the power supplied to the circuit components based on a result of estimation by the noise evaluation unit. According to this arrangement, after how an influence of the noise component changes before and after the change in the magnitude of the power supplied to the circuit components is estimated, the change in the supplied power is actually carried out. This makes it possible to properly control the power supply while considering the influence of the noise component.

The power changing unit changes the power supplied to the circuit components from a first value to a second value, at a timing to start a predetermined trial period, substantially at the same time as the timing to start the predetermined trial period, the gain changing unit changes the gain of the variable-gain circuit by a first gain value as the predetermined amount, with which value the overall gain of the circuit components is unchanged, and the noise evaluation unit compares an influence of the noise component on the desired component within the predetermined trial period with an influence of the noise component on the desired component outside the predetermined trial period. According to this arrangement, how the noise component influences on the desired component when the supplied power is changed from the first value to the second value within the trial period is properly evaluated, and the power supply can be changed based on the evaluation result.

In addition to the above, the present invention is preferably arranged so that the power changing unit changes the power supplied to the circuit components from the second value to the first value at a timing to end the predetermined trial period, and substantially at the same time as the timing to end the predetermined trial period, the gain changing unit changes the gain of the variable-gain circuit by a second gain value as the predetermined amount, with which value the overall gain of the circuit components is unchanged. According to this arrangement since the supplied power is temporarily returned from the second value to the first value at the end of the trial period, it is possible to restrain adverse effects of the change to the second value.

In addition to the above, the present invention is preferably arranged so that the power changing unit changes the magnitude of the power supplied to the variable-gain circuit, and substantially at the same time as the power changing unit changes the magnitude of the power supplied to the variable-gain circuit, the gain changing unit changes the gain of the variable-gain circuit whose power supply has been changed by the power changing unit. According to this arrangement, since the gain of the circuit whose supply power has been changed is changed and the change in the entire gain is canceled out, it is possible to restrain the influence of the change in the gain caused by the change in the supplied power.

In addition to the above, the present invention is preferably arranged so that the received signal is constituted by a signal sequence in which plural unit signals are lined up in time series, and a timing at which the power changing unit changes the power supplied to the circuit components and a timing at which the gain changing unit changes the gain of the variable-gain circuit fall within a temporal range equivalent to one of the unit signals. This restrains the influence of the changes in the supplied power and the gain on the unit signals.

In addition to the above, the present invention is preferably arranged so that the power changing unit changes the power supplied to the circuit components at a timing of the leading end of one of the unit signals, and the gain changing unit changes the gain of the variable-gain circuit at a timing falling within said one of the unit signals. This restrains the number of unit signals influenced by the changes in the supplied power and the gain.

The present invention can be used for various types of digital receivers such as mobile phones and digital television receivers which include a reconstruction unit performing the reconstruction of at least one of text data, sound data, image data, and a computer program product. Such a digital receiver obtains information regarding text data, sound data, image data, a computer program product, etc. from the received signal having been demodulated by the digital demodulating apparatus of the present invention, and reconstruct the text data or the like.

The aforesaid computer program product may be distributed in the form of data recorded on a computer-readable removable recording medium such as a CD-ROM (Compact Disc Read Only Memory) disc, a flexible disc (FD), an MO (Magneto Optical) disc, or in the form of data recorded on a computer-readable fixed recording medium such as a hard disc. Alternatively, the aforesaid computer program product may be distributed over a communications network such as the Internet by a wired or wireless electrical communication unit. The computer program product is not specialized for the digital receiver. For example, the computer program product may be combined with another computer program product which causes a computer to execute other processes, so as to cause a general-purpose computer including a general-purpose processor and the like to function as a digital receiver.

BRIEF DESCRIPTION OF THE DRAWINGS

Other and further objects, features and advantages of the invention will appear more fully from the following description taken in connection with the accompanying drawings in which.

DESCRIPTION OF THE PREFERRED EMBODIMENTS

[First Embodiment]

Figure 1A:
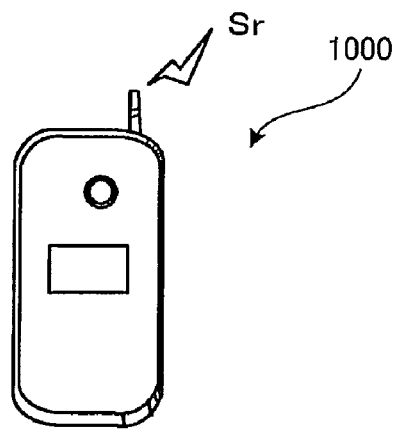
FIG. 1A briefly shows the external appearance of a portable communications device of a First Embodiment of the present invention.
Figure 1B:
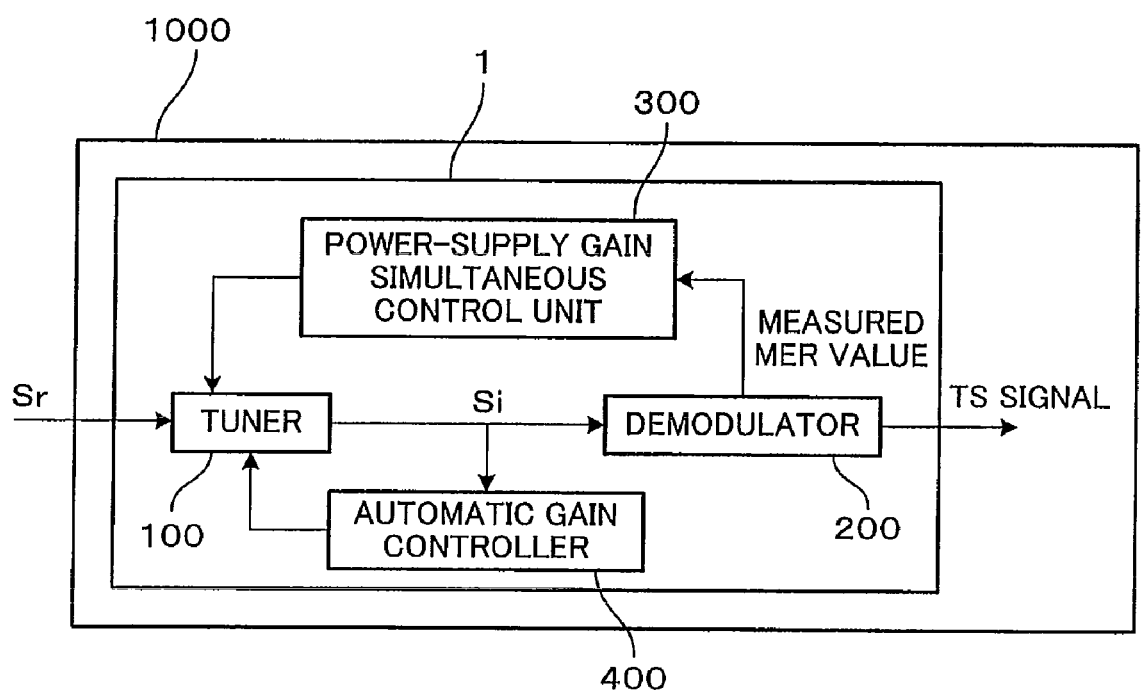
FIG. 1B is a block diagram which outlines the portable communications device.

The following will now describe First Embodiment which is a preferred embodiment of the present invention. FIG. 1 outlines a portable communications device 1000 and a digital demodulating apparatus 1 of the portable communications device 1000 of First Embodiment.

The portable communications device 1000 of the present embodiment includes a digital demodulating apparatus 1. A signal Sr received by an antenna of the portable communications device 1000 is demodulated by the digital demodulating apparatus 1. From the demodulated signal output from the digital demodulating apparatus 1, information regarding data is fetched, for example texts, images, sound, and computer program products These types of data such as texts, images, sound, and computer program products are then reconstructed. These types of data such as texts and images are presented to the user of the portable communications device 1000 through a display and speaker (not illustrated) of the portable communications device 1000. Apart from the portable communications device, the digital demodulating apparatus 1 may be employed in a digital TV receiver (television receiver), wireless LAN (Local Area Network) apparatus, a PC (Personal Computer) having wireless LAN capability, and so on.

The digital demodulating apparatus 1 includes a tuner 100 and a demodulator 200. The tuner 100 performs a tuning process on a signal Sr. In other words, the tuner 100 selectively receives one of plural channels included in the signal Sr. A signal regarding the selectively-received signal is converted into an IF (Intermediate Frequency) signal Si, and the signal after the conversion is supplied to the demodulator 200. The demodulator 200 receives the signal Si from the tuner 100. Receiving the signal, the demodulator 200 generates, from the signal Si, a demodulated signal such as so-called TS (Transport Stream) signal and outputs the same.

The digital demodulating apparatus 1 is constituted by plural circuit components. Unless otherwise stated, each circuit component may be a group of circuit elements each specialized to an individual function or may be software such as a computer program product and data, which causes hardware such as a general-purpose processor circuit and memory to execute the below-described functions. In the latter case, a circuit component is constructed by combining hardware with software.

<Signal Sequence>

Signal sequences received by the portable communications device 1000 are discussed. A signal sequence received by the portable communications device 1000 is transported by plural carrier waves. As an example of the present embodiment, the following presupposes that the scheme for transporting signal sequences received by the portable communications device 1000 is OFDM (Orthogonal Frequency Division Multiplexing).

A signal in compliance with OFDM is constituted by a signal sequence in which many symbols each having a predetermined length are lined up. A single symbol includes plural unit signals which are overlapped with one another. These unit signals are arranged so that carrier waves having different frequencies are modulated in accordance with data with a predetermined length. In addition to a valid part including actual data, each symbol includes a guard interval. The guard interval has a signal component completely identical with a part of the tailing end of the valid part, and is provided at the leading end of each symbol. The guard interval is used for removing from a received signal an influence of plural multi-path waves occurring on a transmission path from a transmitter which transmits a signal sequence to the portable communications device 1000. It is noted that the length of the valid part of a single symbol is termed valid symbol length.

The signal in compliance with OFDM further includes plural scattered pilot signals. The scattered pilot signals included in the signal in compliance with OFDM are disposed at equal intervals both in the frequency direction and the temporal direction, when the unit signals in the signal sequence are disposed on a plane defined by the temporal direction and the frequency direction. The scattered pilot signals are arranged so that a numerical sequence represented by a predetermined coding system or the like is inserted into the signal sequence in a predetermined order. In other words, the scattered pilot signals are disposed in the signal sequence in such a way that a numerical sequence represented by a predetermined coding system is reconstructed when the numbers represented by the respective scattered pilot signals in the signal sequence are lined up in accordance with the predetermined order.

In addition to the above, the signal sequence of the present embodiment is encoded in various ways and subjected to interleave which is required to perform error correction for correcting an error in the signal sequence. Examples of encoding schemes for the encoding above are RS (Reed-Solomon) encoding and Viterbi encoding. Examples of the interleave include bit interleave, byte interleave, time interleave, and frequency interleave. In these schemes, sets of data corresponding to respective signals in a transmitted signal are reordered in according with time, frequency, or the like. The signal sequence having been interleaved and variously encoded is decoded and deinterleaved in a manner as below in the portable communications device 1000, with the result that an error in the signal sequence may be corrected.

The signal sequence of the present embodiment is usable in the digital terrestrial broadcasting in Japan, for example. The signal transmission scheme of the digital terrestrial broadcasting in Japan is ISDB-T (Integrated Services Digital Broadcasting-Terrestrial). In addition to the above, the signal sequence of the present embodiment is usable in communication schemes such as the digital terrestrial broadcasting standard in China (GB20600-2006), the digital terrestrial broadcasting standard in Europe (DMB-T/H), Power Line Communication, and wireless LAN.

<Tuner>

Figure 2:
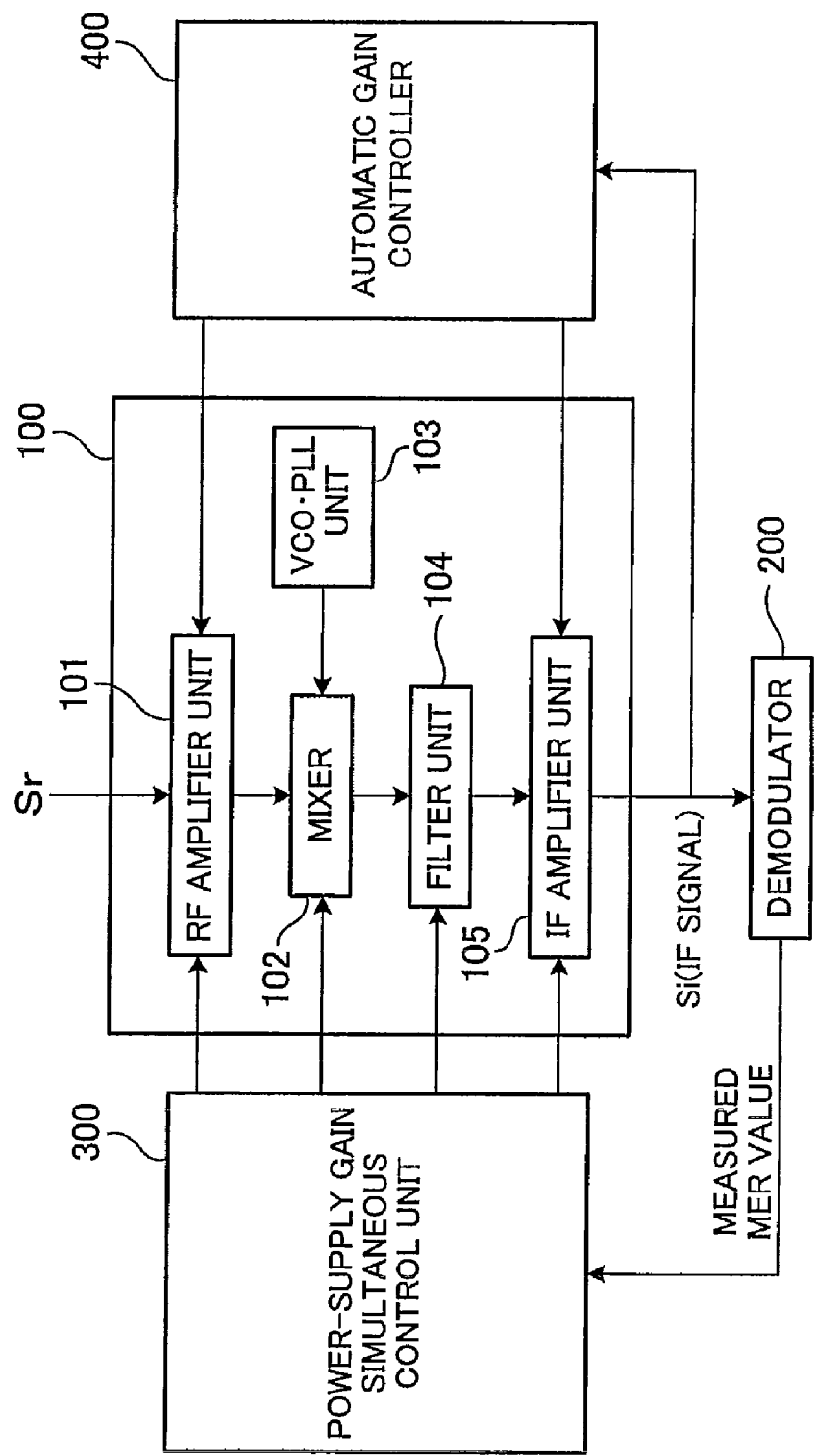
FIG. 2 is a block diagram showing the tuner of FIG. 1 and its surroundings.

The tuner 100 will be detailed herein below. FIG. 2 is a block diagram of the tuner 100. The tuner 100 includes an RF amplifier unit 101, a mixer 102, a VCO•PLL unit 103, a filter unit 104, and an IF amplifier unit 105. A signal Sr supplied to the tuner 100 is amplified by the RF amplifier unit 101 and then output to the mixer 102. In the meanwhile, the VCO•PLL unit 103 generates a mixing signal based on a frequency equivalent to a particular channel (tuning process). The mixing signal generated by the VCO•PLL unit 103 is output to the mixer 102. The mixer 102 generates an IF signal Si corresponding to an IF frequency, from the output signal Sr supplied from the RF amplifier unit 101 and the mixing signal supplied from the VCO•PLL unit 103.

The IF signal Si generated by the mixer 102 is output to the filter unit 104. The filter unit 104 removes an unnecessary signal component from the output signal Si supplied from the mixer 102. After the removal of the unnecessary signal component, the signal Si is supplied to the IF amplifier unit 105. The IF amplifier unit 105 amplifies the output signal Si supplied from the filter unit 104 and outputs the amplified signal Si to the demodulator 200.

Each of the RF amplifier unit 101 and the IF amplifier unit 105 is arranged to be a variable-gain amplifier (variable-gain circuit) which can change the amplification factor of a signal. As shown in FIG. 1and FIG. 2, the digital demodulating apparatus 1 is provided with an automatic gain controller 400 (AGC) which adjusts the gains of the RF amplifier unit 101 and the IF amplifier unit 105. The automatic gain controller 400 measures the intensity of the signal Si supplied from the tuner 100, and calculates an average of intensities measured over a long period of time. Based on the average of the intensities of the signal Si, the automatic gain controller 400 controls the gains of the RF amplifier unit 101 and the IF amplifier unit 105 so that the intensity of the signal Si is kept at a predetermined level. Specifically, when either the average or the maximum value of the signal Si within a certain period of time becomes higher than a predetermined value, the automatic gain controller 400 decreases the gains of the RF amplifier unit 101 and the IF amplifier unit 105. On the other hand, when either the average or the maximum value of the signal Si within a certain period of time becomes lower than a predetermined value, the automatic gain controller 400 increases the gains of the RF amplifier unit 101 and the IF amplifier unit 105.

Alternatively, the automatic gain controller 400 may control the gains of the RF amplifier unit 101 and the IF amplifier unit 105 so that the intensity of the signal Si is kept at a predetermined level based on the intensity of the signal Si measured by the demodulator 200. For example, the automatic gain controller 400 may control the gains of the RF amplifier unit 101 and the IF amplifier unit 105 in such a manner that the intensity of the signal Si is measured by the demodulator 200 over a long period of time and the gains are controlled based on an average or the maximum value of the measured values.

<Demodulator>

Figure 3:
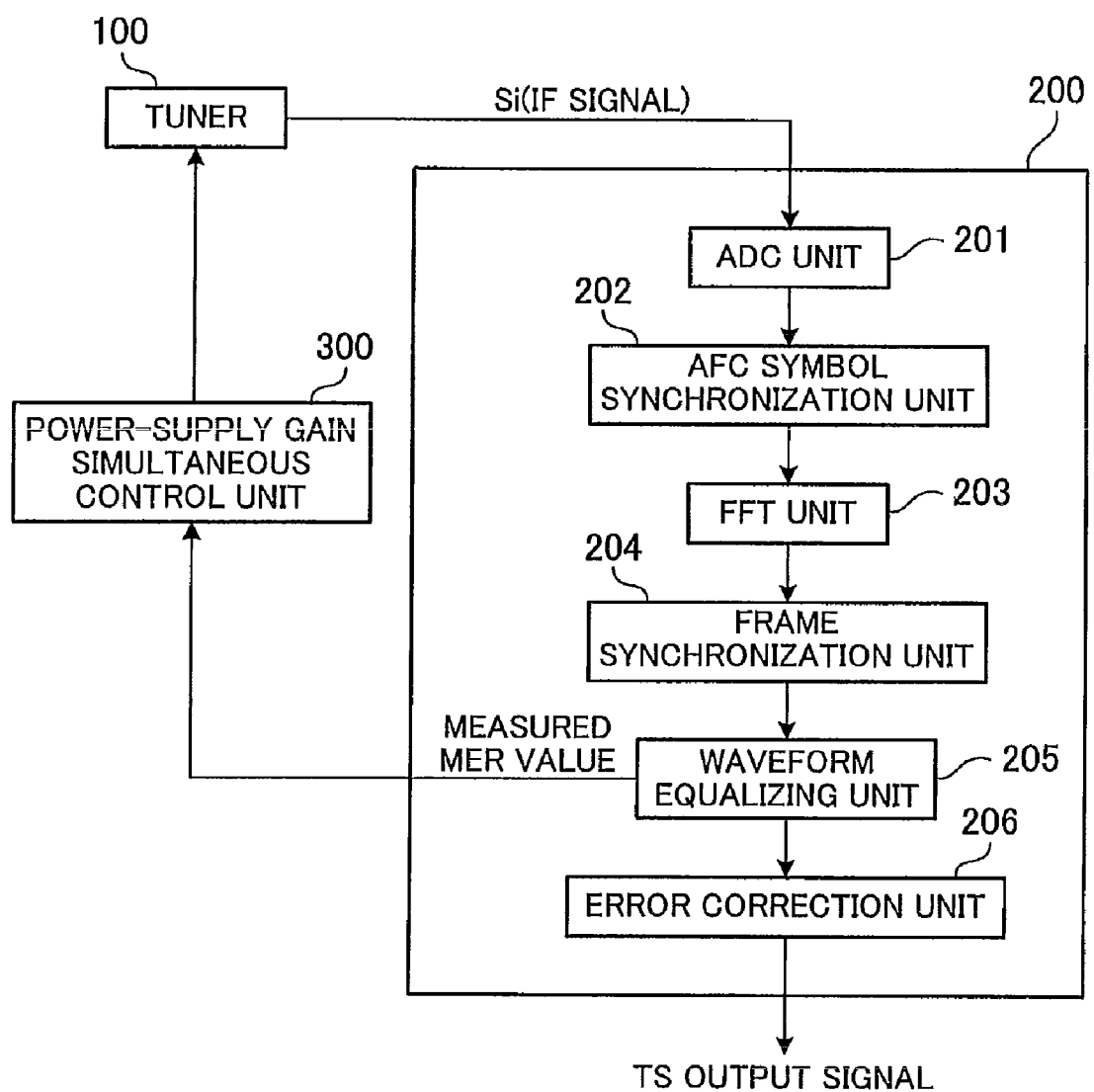
FIG. 3 is a block diagram showing the demodulator of FIG. 1 and its surroundings.

The following will now describe the demodulator 200. FIG. 3 is a block diagram of the demodulator 200. As shown in FIG. 3, the demodulator 200 is constituted by later-described plural circuit components such as an ADC unit 201.

The demodulator 200 includes an ADC unit 201, an AFC symbol synchronization unit 202, an FFT unit 203, a frame synchronization unit 204, an waveform equalizing unit 205, and an error correction unit 206. The IF signal Si output from the tuner 100 is supplied to the ADC unit 201. The ADC unit 201 converts the input signal Si which is an analog signal into a digital signal, and outputs the digital signal to the AFC symbol synchronization unit 202. Alternatively, in addition to the above, the ADC unit 201 measures the intensity of the input signal Si which is an analog signal, calculates an average or the maximum value of the intensities which have been measured over a long period of time, and outputs the intensity of the signal Si to the automatic gain controller 400.

The AFC symbol synchronization unit 202 performs filtering or the like on the digital signal supplied from the ADC unit 201. The AFC symbol synchronization unit 202 then determines the start point of Fourier transform by the later-described FFT unit 203, i.e. determines the symbol synchronization point so as to achieve symbol synchronization, and outputs the digital signal to the FFT unit 203. Alternatively, the AFC symbol synchronization unit 202 may output information regarding the symbol synchronization point to a power-supply gain simultaneous control unit 300 or the AFC symbol synchronization unit 202 may figure out information concerning a mode indicating the valid symbol length and transmits this information to the power-supply gain simultaneous control unit 300.

In ISDB-T, There are following modes each indicating a valid symbol length: mode 1 (valid symbol length of 252 µs), mode 2 (valid symbol length of 504 µs) and mode 3 (valid symbol length of 1008 µs). To determine the symbol synchronization point, a point where receiving with the minimum influence of multi-path waves is possible is selected as the synchronization point. Other ways to determine the synchronization point are such that, for example, correlations between signals are referred to or a phase difference is corrected by using a pilot signal such as a scattered pilot signal.

FFT (Fast Fourier Transform) unit 203 conducts (time-frequency) Fourier transform of the digital signal supplied from the AFC symbol synchronization unit 202. This Fourier transformation is typically fast Fourier transformation (FFT). The FFT unit 203 serially outputs digital signals after the Fourier transformation to the frame synchronization unit 204.

The frame synchronization unit 204 performs frame synchronization in the digital signal supplied from the FFT unit 203. One frame is for example constituted by 204 symbols, and a set of TMCC information is obtained from the signal of one frame. The digital signal in which the synchronization has been achieved by the frame synchronization unit 204 is supplied to the waveform equalizing unit 205.

The waveform equalizing unit 205 conducts, based on the scattered pilot signals in the digital signal, waveform equalization of the digital signal in which the synchronization has been achieved by the frame synchronization unit 204.

The waveform equalization consists of the following steps. First, the waveform equalizing unit 205 extracts the scattered pilot signals from the signal sequence supplied from the frame synchronization unit 204. On the other hand, the waveform equalizing unit 205 serially generates, as reference signals, signals representing a numerical sequence based on the predetermined coding system used in the scattered pilot signals. The generated reference signals are then subtracted from the extracted scattered pilot signals.

Thereafter, the waveform equalizing unit 205 interpolates the result of the subtraction both in the temporal direction and the frequency direction. The interpolation is carried out by using a scheme such as linear interpolation, maximum likelihood estimation, or the like. The waveform equalizing unit 205 then subtracts the value after the interpolation from each of the unit signals in the signal sequence supplied from the frame synchronization unit 204. In this way, the waveform equalization of the signal sequence is carried out. The unit signals after the waveform equalization are demapped into sets of data each having a predetermined data length. The result of the demapping is supplied to the error correction unit 206.

The waveform equalizing unit 205 measures, when the signal sequence is demapped, a difference between the constellation of the signal sequence after the waveform equalization and a reference value of the constellation of each unit signal, i.e. measures a MER (Modulation Error Ratio) value of each unit signal. This MER value indicates an error in the constellation of the received signal. Signals input to the waveform equalizing unit 205 may include various noise components, along with desired components which are related to information transmitted by the signals. The aforesaid error in the constellation mainly occurs due to various noise components generated on the transmission path to the waveform equalizing unit 205. In the present embodiment, the larger the MER value is, the smaller the intensity of the noise component is as compared to the intensity of the entire signal. The measured MER values of the respective unit signals, which have been measured by the waveform equalizing unit 205, are output to the later-described power-supply gain simultaneous control unit 300, in the order in which the waveform equalization was conducted.

The error correction unit 206 performs error correction of the signal supplied from the waveform equalizing unit 205. The error correction consists of decoding and deinterleaving corresponding to the interleaving of the signal by the sender. The digital signal which has been variously interleaved is re-changed by the deinterleaving to the digital signal before the interleaving, and the digital signal having been variously encoded is re-changed by the decoding to the digital signal before the encoding. As a result, errors occurring on the signal during the transportation on the transmission path are corrected. Alternatively, the error correction unit 206 may measure an amount of error correction at the time of error correction of the digital signal, so as to calculate a BER (Bit Error Rate) value. The calculated BER may be output to the later-described power-supply gain simultaneous control unit 300. As discussed above, the digital signal having been demodulated by the demodulator 200 is output from the demodulator 200 as a TS signal.

The measured MER value calculated by the waveform equalizing unit 205 indicates an influence of noise components on a desired component in the signal, as described above. Such noise components are roughly categorized into two types in accordance with the causes thereof. The first type of error components are generated because a signal received by the portable communications device 1000 includes an interference wave. Such an interference wave is equivalent to a frequency component which is different from a desired frequency component from which information is fetched by demodulating the signal. The received signal includes a signal whose channel neighboring to the desired frequency component and a signal transmitted from a different sender. Such signals may act as interference waves. The second type of error components are generated due to reasons such as thermal noise in a circuit component. Hereinafter, the first type will be referred to as interference wave noise and the second type will be referred to as other noise.

Figure 4:
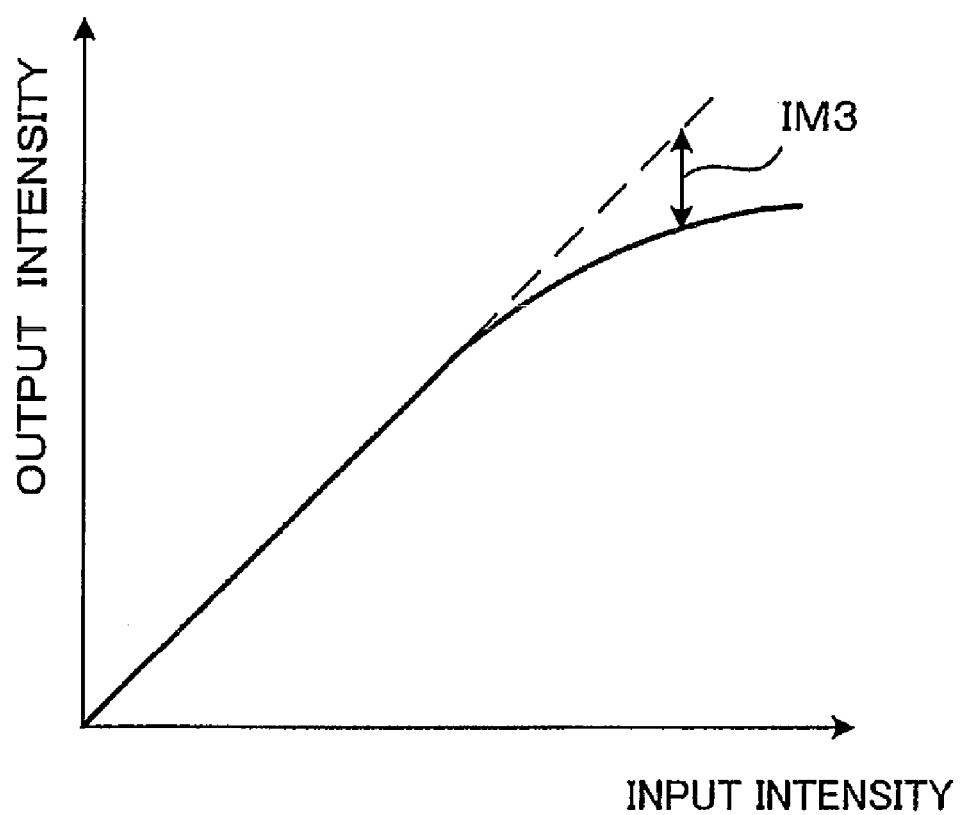
FIG. 4 is a graph of a case where a signal is distorted in a circuit component.

The interference wave noise may induce signal distortion because interference waves different from a desired wave in a received signal influence on the frequency of the desired wave on account of the non-linearity of each circuit component. For example, the chain line in FIG. 4 indicates a case where an output signal is linearly amplified in an optimal manner with respect to the intensity of an input signal of the RF amplifier unit 101. In the meanwhile, a signal output from the RF amplifier unit 101 includes a component which is non-linear with respect to the input signal. Such a non-linear component increases as the intensity of the signal input to the RF amplifier unit 101 increases. The intensity of this non-linear component changes in accordance with an IIP3 (3rd order Input Intercept Point) of the RF amplifier unit 101. This IIP3 is one of indicators of the linearity of circuits. If a signal input to the RF amplifier unit 101 includes an interference wave, non-linear components of a signal output from the RF amplifier unit 101 includes components caused by the interference wave. Such components may act as noise components in relation to a desired component, e.g. inter-modulation distortion and cross-modulation distortion. Such noise components are interference wave noise. The full line in FIG. 4 indicates a case where an output signal of the RF amplifier unit 101 is distorted due to inter-modulation distortion (IM3). The interference wave noise increases as an interference wave in the input signal increases.

In the meanwhile, the other noise is generated due to heat from a resistive element in a circuit component, the base resistance and emitter resistance of a transistor, and the like. The other noise includes so-called shot noise which occurs when electric charges move across an energy barrier in case that an analog circuit has pn (positive-negative) junction, for example, and so-called flicker noise which is generated when electric charges are trapped at the interface between the oxide of MOSFET (Metal-Oxide-Semiconductor Field Effect Transistor) and silicon. Being different from the aforesaid interference wave noise, these types of noise are more or less at a constant level unless the operating environment of the circuit component is changed, irrespective of the intensity of the input signal to the circuit component.

<Current Control>

The linearity of a circuit component varies in accordance with a current supplied to that circuit component. For example, in an analog circuit, the linearity of the output signal with respect to the input signal is improved as the current supplied to this circuit component is intensified.

Therefore, when the receiving state of the portable communications device 1000 is poor and hence the received signal of the tuner 100 includes an interference wave different from a desired wave, a current supplied to a circuit component is increased so that the linearity thereof is improved. This restrains a non-linear component from being included in the signal Si supplied from the tuner 100. In the meanwhile, when the receiving state of the portable communications device 1000 is good, an interference wave in a signal received by the portable communications device 1000 is weak and hence a non-linear component may be negligible even if the linearity of the circuit component is not improved so much. Also in this case, the power consumption of the tuner 100 may be excessive when a current supplied to the circuit component is large.

Figure 5:
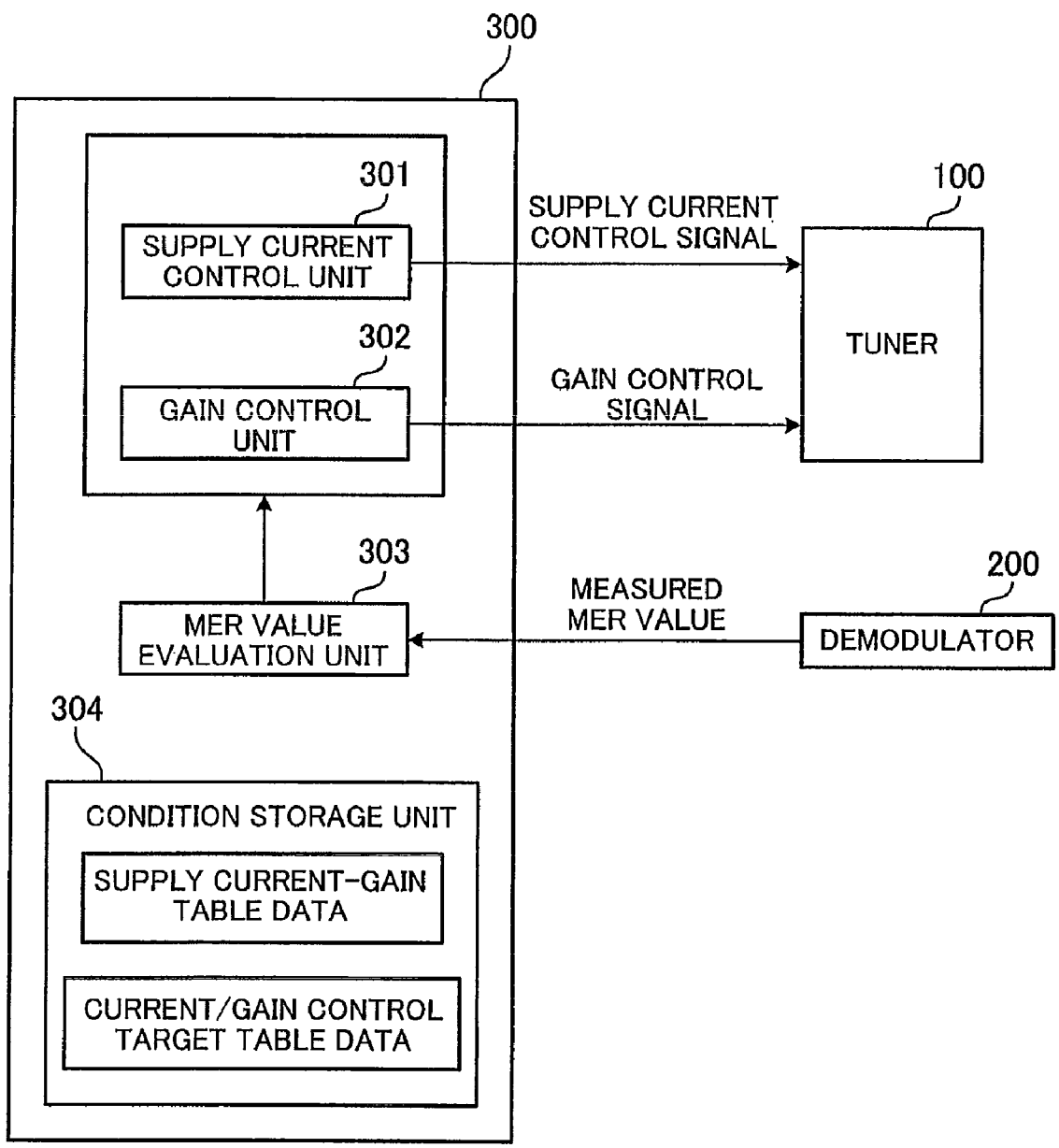
FIG. 5 is a block diagram showing the power-supply gain simultaneous control unit of FIG. 1-FIG. 3 and its surroundings.

In consideration of the above, the digital demodulating apparatus 1 is provided with a power-supply gain simultaneous control unit 300 as shown in FIGS. 1-3. FIG. 5 is a block diagram detailing the power-supply gain simultaneous control unit 300. The power-supply gain simultaneous control unit 300 has a supply current control unit 301 which controls a supply current to the tuner 100. The supply current control unit 301 changes the magnitudes of currents supplied to the RF amplifier unit 101 the mixer 102, the filter unit 104, and the IF amplifier unit 105, and/or keeps the magnitudes of these currents constant.

The power-supply gain simultaneous control unit 300 further includes an MER value evaluation unit 303 which evaluates a measured MER value supplied from the demodulator 200. The MER value evaluation unit 303 evaluates an influence of a noise component on a desired component based on the measured MER value from the demodulator 200, and outputs the evaluation result to the supply current control unit 301. Based on the evaluation result of the MER value evaluation unit 303, the supply current control unit 301 controls a supply current to each circuit component of the tuner 100.

More specifically, the supply current control unit 301 controls the supply currents as follows. The MER value evaluation unit 303 has detection reference values based on which whether the receiving state is good or not is determined. The detection reference values include a current decrease reference value which is referred to for current decrease and a current increase reference value which is referred to for current increase. The MER value evaluation unit 303 compares the current decrease reference value with the measured MER value, and determines that the receiving state is improved if the measured MER value is higher than the current decrease reference value. Also, the MER value evaluation unit 303 compares the current increase reference value with the measured MER value, and determines that the receiving state is deteriorated if the measured MER value is lower than the current increase reference value.

When the MER value evaluation unit 303 has determined that the receiving state is improved, the supply current control unit 301 decreases the supply current to each circuit component of the tuner 100. When the MER value evaluation unit 303 has determined that the receiving state is deteriorated, the supply current control unit 301 increases the supply current to each circuit component of the tuner 100. The current increase reference value is higher by a predetermined value than the lowest MER value with which the reconstruction of image data or the like from a signal after the demodulation is possible. The current decrease reference value is arranged to be an MER value higher than the current increase reference value.

<Gain Control>

Figure 6:
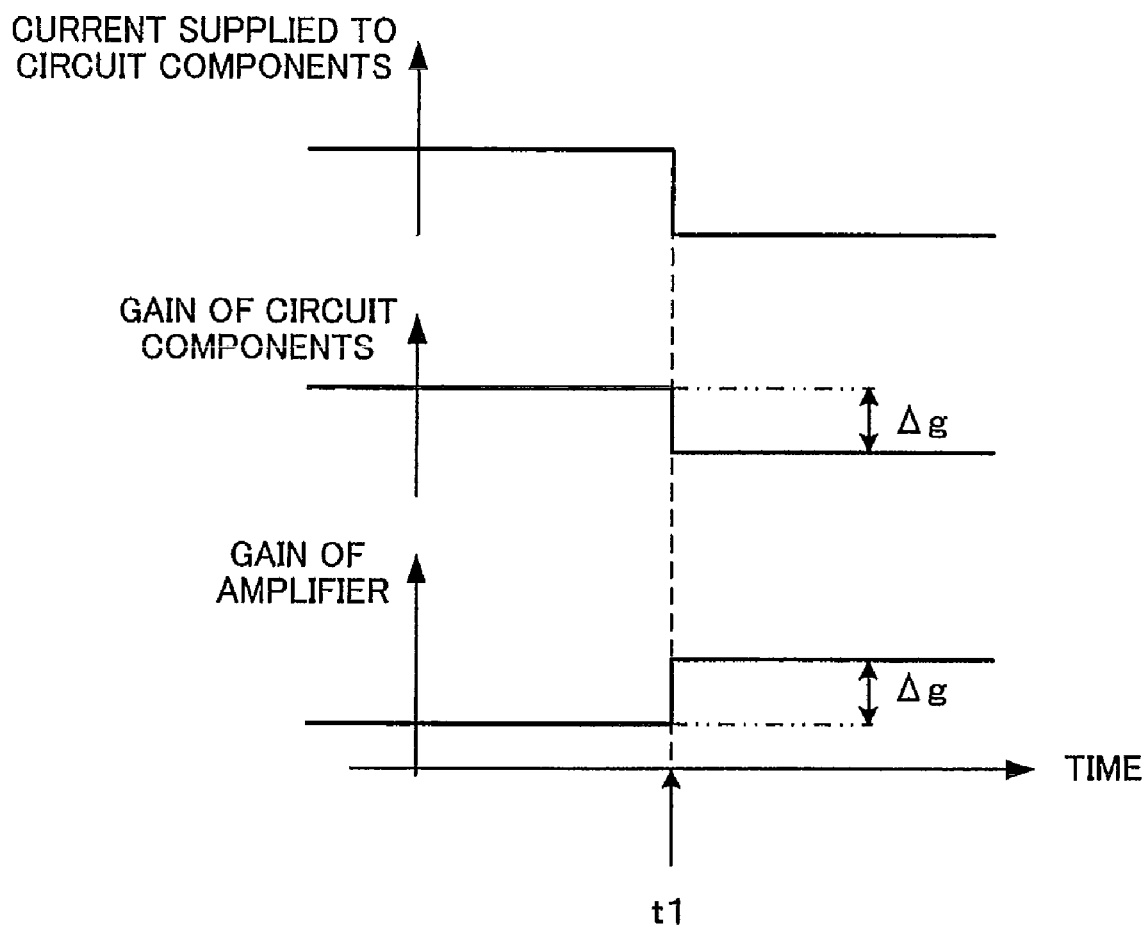
FIG. 6 is a timing chart showing changes in a supply current to a circuit component in the tuner and changes in the gain of the amplifier unit.

In some circuit components, the gain is changed in response to a change in a supply current. FIG. 6 is a timing chart showing changes in a supply current to a circuit component in the tuner 100 and changes in the gain. This circuit component is any one of the circuit components of the tuner 100, for example the RF amplifier unit 101. FIG. 6 shows a case where a supply current to the circuit component is decreased at time t1. As a result of this, the gain of the circuit component decreases by $\Delta g$ at the time t1.

As the gain of the circuit component A changes in this way, the gain of the entire tuner 100 changes and also the intensity of the signal Si output from the tuner 100 changes. As the intensity of the signal Si changes, the demodulator 200 may not be able to properly carry out demodulation. This is because, the signal intensity required for proper demodulation is not obtained when the intensity of the signal Si is too low, whereas the signal is distorted and hence proper demodulation is impossible when the intensity of the signal Si is too high. In consideration of changes in the intensity of the signal Si, the aforesaid automatic gain controller 400 is provided in the present embodiment. Upon detecting a change of the intensity of the signal Si from a predetermined level, the automatic gain controller 400 controls the gains of the RF amplifier unit 101 and the IF amplifier unit 105 in such a way that the intensity of the signal Si returns to the original level. As a result the intensity of the signal Si returns to the original level.

However, as described above, the automatic gain controller 400 controls the gains of the RF amplifier unit 101 or the like based on an average of detected intensities of the signal Si. Therefore the signal Si gradually returns to the original level. Since it takes time to return the intensity of the signal Si to the original level as above, demodulation may not be properly carried out during this period of time before the return to the original level.

In consideration of the above, the power-supply gain simultaneous control unit 300 is provided with a gain control unit 302 which controls the gain in accordance with the control of the supply current to the tuner 100. The gain control unit 302 changes the gain of either the RF amplifier unit 101 or the IF amplifier unit 105 in such a way as to cancel out a change in the gain due to a change in the supply current to the circuit component A, almost at the same time as the supply current control unit 301 changes the supply current to the circuit component A. In the example shown in FIG. 6, the gain control unit 302 increases the gain of an amplifier by $\Delta g$ at the time t1. This amplifier is either the RF amplifier unit 101 or the IF amplifier unit 105.

More specifically, the power-supply gain simultaneous control unit 300 arranged as below, in order to simultaneously achieve supply current control and gain control. The power-supply gain simultaneous control unit 300 includes a condition storage unit 304. The condition storage unit 304 stores a current/gain control target table. An example of this table is shown in Table 1. In addition to the above, the condition storage unit 304 stores, for each circuit component which is a target of current control, data indicating a supply current-gain table. An example of this table is shown in Table 2.

TABLE 1

| Current Control Target | Gain Control Target |
|---|---|
| RF amplifier unit | RF amplifier unit |
| Mixer | RF amplifier unit |
| ... | ... |
| IF amplifier unit | IF amplifier unit |

TABLE 2

| Current Control Target: Mixer | |
|---|---|
| Supply Current | Gain |
| $I_1 \rightarrow I_2$ | Decrease by $\Delta G_1$ |
| $I_2 \rightarrow I_3$ | Decrease by $\Delta G_2$ |
| $I_3 \rightarrow I_4$ | Decrease by $\Delta G_3$ |

In Table 1 above, a circuit component which is a current control target is associated with an amplifier whose gain is changed simultaneously with the change in the supply current to the target circuit component. According to Table 1, an amplifier whose gain is changed simultaneously with the change in the supply current to the RF amplifier unit 101 is the RF amplifier unit 101 In addition to the above, an amplifier whose gain is changed simultaneously with the change in the supply current to the mixer 102 is the RF amplifier unit 101. Furthermore, an amplifier whose gain is changed simultaneously with the change in the supply current to the IF amplifier unit 105 is the IF amplifier unit 105.

Table 1 is arranged so that (1) when the current control target is an amplifier unit, the gain control target is identical with the current control target, whereas (2) when the current control target is not an amplifier unit, an amplifier unit which is closest to the current control target is selected as the gain control target.

Table 2 above is an example of a table in which a change in a supply current to a circuit component is associated with a degree of change in the gain in response to the change in the supply current. Table 2 shows cases where the current control target is the mixer 102. In Table 2, I1 to I4 represent different current magnitudes. Table 2 indicates that the amounts of decrease in the gain are ΔG1-ΔG3 when the supply current changes from I1 to I2, from I2 to I3, and from I3 to I4. According to Table 2, when, for example, the current supplied to the mixer 102 is changed from I1 to I2, the gain of the RF amplifier unit 101, which is the gain control target corresponding to the mixer 102 according to Table 1, is increased by ΔG1. This cancels out the change in the gain of the mixer 102 by changing the gain of the RF amplifier unit 101. When the current supplied to the mixer 102 is changed from I3 to I4, the gain of the RF amplifier unit 101, which is the gain control target corresponding to the mixer 102 according to Table 1, is increased by ΔG3. With this, the change in the gain of the mixer 102 is canceled out by changing the gain of the RF amplifier unit 101.

Based on Tables 1 and 2 above, the supply current control unit 301 and the gain control unit 302 control the supply currents to the respective circuit components and the gains of the RF amplifier unit 101 and IF amplifier unit 105. For example, when the supply current control unit 301 changes the supply current to the mixer 102 from I2 to I3, the gain control unit 302 increases the gain of the RF amplifier unit 101 by ΔG2 at the same time as the supply current control unit 301 changes the supply current. On the other hand, when the supply current control unit 301 changes the current to the mixer 102 from I3 to I2, the gain control unit 302 decreases the gain of the RF amplifier unit 101 by ΔG2 at the same time as the supply current control unit 301 changes the supply current. As a result, the change in the gain of the mixer 102 caused by the change in the supply current to the mixer 102 is canceled out by the change in the gain of the RF amplifier unit 101.

<Power-Supply Gain Control>

Figure 7:
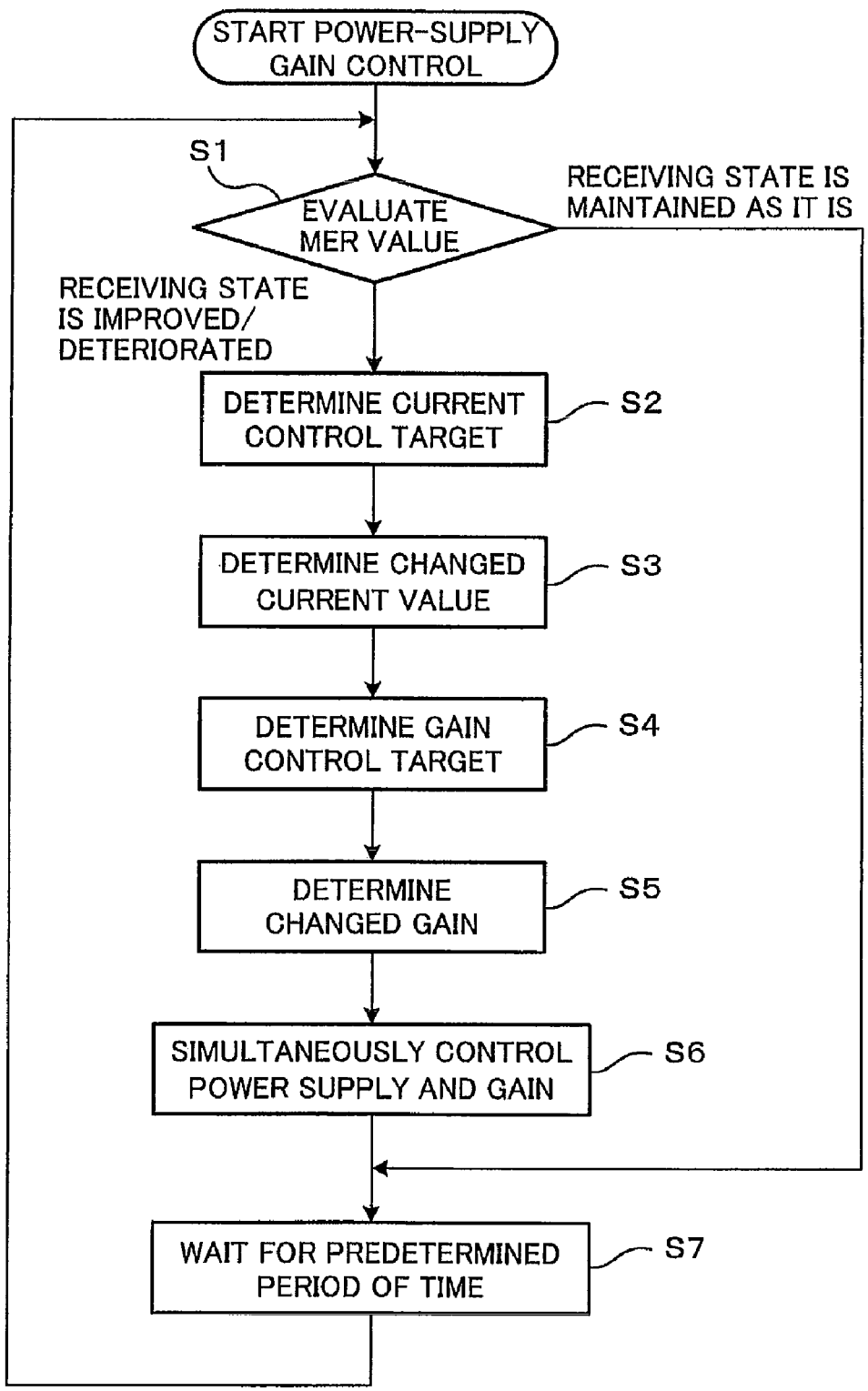
FIG. 7 is a flowchart showing the steps of power-supply gain control executed by the power-supply gain simultaneous control unit.

The steps performed in the power-supply gain control by the power-supply gain simultaneous control unit 300 will be described in sequence. FIG. 7 is a flowchart showing a series of steps in the power-supply gain control.

First, the MER value evaluation unit 303 evaluates an influence of noise components based on a measured MER value from the demodulator 200 (Step S1). The evaluation is carried out based on comparisons between the measured MER value and reference values as described above. When the measured MER value is higher than the current decrease reference value, it is evaluated that the receiving state is improved. On the other hand, when the measured MER value is lower than the current increase reference value, it is evaluated that the receiving state is deteriorated.

When the MER value evaluation unit 303 has determined that the receiving state is neither improved nor deteriorated, i.e. the receiving state maintains the status quo (Step S1, "receiving state maintains status quo"), the process proceeds to Step S6. When the MER value evaluation unit 303 has determined that the receiving state is improved or deteriorated (Step S1, "receiving state is improved/deteriorated"), the supply current control unit 301 determines which circuit component is the target of current control (Step S2) and determines a current value after the change (Step S3).

The target of current control is determined in such a way that, for example, circuit components such as the RF amplifier unit 101 are serially selected one by one or all circuit components are selected at once. The current value after the change is determined based on the result of evaluation of MER value in Step S1. For example, when the MER value evaluation unit 303 has determined in Step S1 that the receiving state is improved, the current value after the change is determined to be smaller than the current value of the present. When the MER value evaluation unit 303 has determined in Step S1 that the receiving state is deteriorated, the current after the change is determined to be larger than the current of the present.

Subsequently, the gain control unit 302 determines the gain control target and an amount of change in the gain, based on the current value after the change determined by the supply current control unit 301 (Steps S4 and S5). For example, when the supply current control unit 301 has determined in Steps S2 and S3 that the current supplied to the mixer 102 is changed from I3 to I4, the gain control unit 302 determines with reference to Tables 1 and 2 that the gain of the RF amplifier unit 101 will be increased by ΔG3.

Thereafter, the supply current control unit 301 and the gain control unit 302 changes the magnitude of the supply current to the circuit component and changes the gain of either the RF amplifier unit 101 or the IF amplifier unit 105, based on the results of Steps S2 through S5 (Step S6). Thereafter, after a predetermined period of time has elapsed in Step S7, the power-supply gain simultaneous control unit 300 repeats the steps from Step S1.

As discussed above, in the present embodiment, the gain of the entire tuner 100 before the change in the supply current by the supply current control unit 301 is identical with the gain after the change, and hence the intensity of the output signal Si from the tuner 100 does not change. The gain control of the present embodiment is different from the gain control by the gain control by the automatic gain controller 400 in that the gain is changed at the same time as the supply current is changed in the present embodiment. For this reason a change in the supply current scarcely influences on the gain.

Furthermore, as discussed above, when the supply current to the RF amplifier unit 101 or the IF amplifier unit 105 is changed, the gain of the amplifier unit whose supply current is changed is changed at the same time. On the other hand, when the gain of an amplifier unit whose supply current is not changed is changed, the gain of the amplifier unit whose supply current has been changed is changed even if the gain of the entire tuner 100 is canceled out.

For example, when the gain of the RF amplifier unit 101 increases as the supply current to the RF amplifier unit 101 increases, the gain of the IF amplifier unit 105 is decreased so that the gain of the entire tuner 100 does not increase, but the gain of the RF amplifier unit 101 increases. This may induce a problem such that an interference wave in the output signal of the RF amplifier unit 101 is increased and hence an influence of interference wave noise occurring in circuit components on the stages later than the RF amplifier unit 101 becomes significant. On the other hand, when the gain of the RF amplifier unit 101 decreases as the supply current to the RF amplifier unit 101 decreases, the gain of the IF amplifier unit 105 is increased so that the gain of the entire tuner 100 does not change, but the gain of the RF amplifier unit 101 decreases. In this case, the intensities of signals input to the circuit components on the stages later than the RF amplifier unit 101 are decreased, so that an influence of other noise components occurring in the circuit components on the stages later than the RF amplifier unit 101 may become significant.

In this way, when an amplifier whose supply current is changed is different from an amplifier whose gain is changed, influences of interference wave noise and other noise components on the signal Si supplied from the tuner 100 to the demodulator 200 may be varied. Concerning this problem, the present embodiment is arranged so that, as discussed above, the target of gain change is identical with the amplifier unit whose supply current is changed. It is therefore possible to restrain a variation in the influence of the noise components.

When the target of supply current change is a circuit component which is not an amplifier unit, the gain of an amplifier unit which is the closest to that circuit component is changed. Therefore, for the same reason as above, it is possible to restrain changes in influences of noise components as compared to a case where an amplifier unit whose gain is changed is far from the circuit component which is the current control target.

Figure 8A:
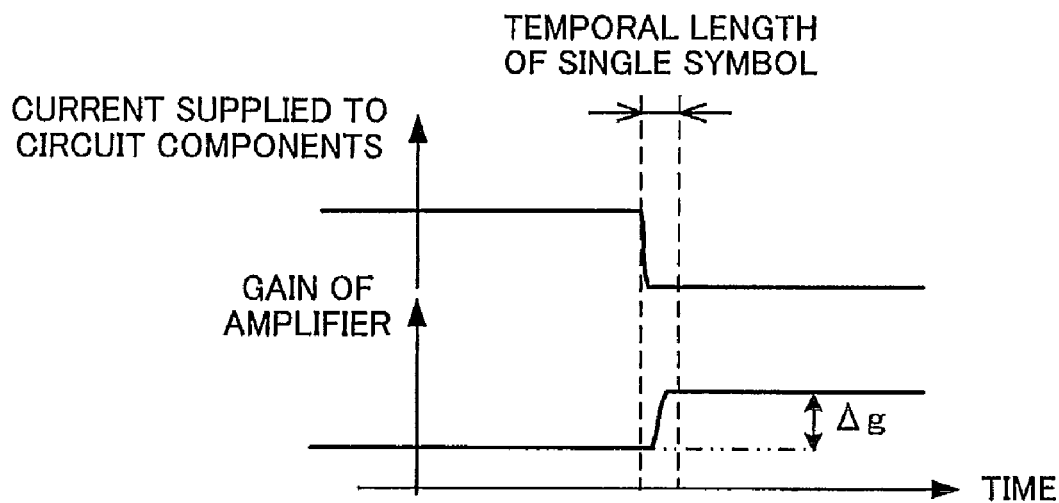
FIGS. 8A and 8B are timing charts different from FIG. 6, showing changes in a supply current to a circuit component in the tuner and changes in the gain of the amplifier unit.
Figure 8B:
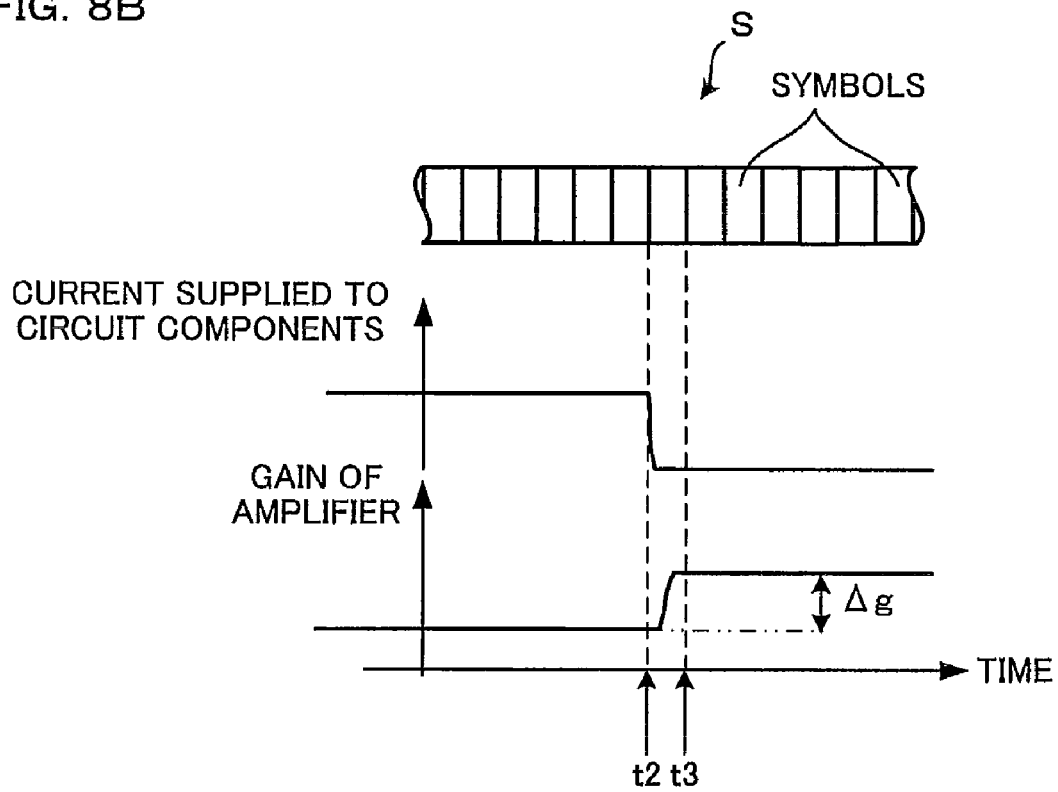

It is noted that the present embodiment assumes, as shown in FIG. 6, an ideal case where a change in the supply current by the supply current control unit 301 and a change in the gain by the gain control unit 302 simultaneously start and these changes are finished immediately after the start. However, there are cases where there is a transition period between the start of changes in the supply current and the gain and the end thereof. Also, there are cases where disturbance occurs for some reasons. FIG. 8A and FIG. 8B show, as an example. a case where a transition period coincides a supply current change and/or a gain change. In such a case, it may be difficult to simultaneously start supply current change and gain change and simultaneously end them.

The present invention presumes that a supply current change and a gain change are carried out substantially simultaneously. In the present invention, "substantially simultaneous" indicates, as shown in FIG. 8A, cases where a timing at which a supply current change starts and a timing at which a gain change starts fall within a temporal range equivalent to a single symbol. With this, even if a transition period or disturbance coincides the supply current change or the gain change, the number of symbols influenced by the same is limited in the received signal. For this reason a slight difference between a timing of supply current change and a timing of gain change scarcely influences on signal demodulation. The aforesaid timings of supply current change and gain change can be arbitrarily set within a temporal range equivalent to one symbol. However, it is preferable that the gap between these timings is as short as possible.

In addition to the above, the timing of supply current change is preferably in sync with the leading end of one of one of the symbols. FIG. 8B schematically shows a signal S in which plural symbols are temporarily lined up. The timing of supply current change is in sync with a time t2 which is the leading end of one of these symbols. When the timing to start the change in supply current is not at the leading end of a symbols, supply current change and/or gain change may influence on two or more symbols. On the other hand, when the timing to start the change in supply current is in sync with the leading end of a symbol as shown in FIG. 8B, it is possible to restrain the influences of supply current change and/or gain change within a minimum number of symbols. Being different from the above, when supply current change is conducted after gain change, the timing of gain change is arranged to be in sync with the leading end of a symbol.

[Second Embodiment]

The following will now describe Second Embodiment which is another embodiment of the present invention.

Figure 9:
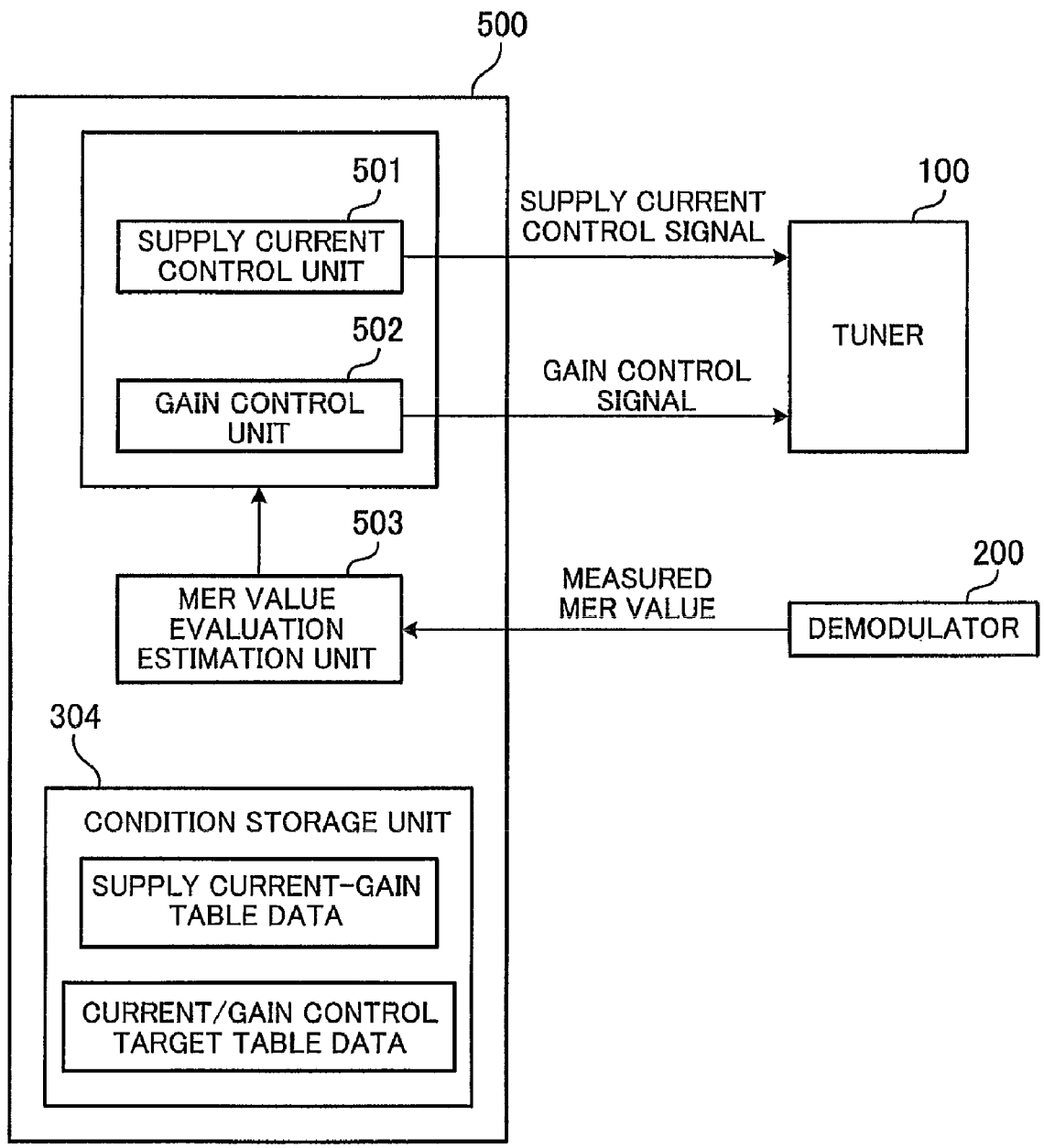
FIG. 9 is a block diagram showing a power-supply gain simultaneous control unit of Second Embodiment which is another embodiment of the present invention and its surroundings.

FIG. 9 is a block diagram of a power-supply gain simultaneous control unit 500 of Second Embodiment. This power-supply gain simultaneous control unit 500 is provided in place of the power-supply gain simultaneous control unit 300 of First Embodiment. In the power-supply gain simultaneous control unit 500, a supply current control unit 501, a gain control unit 502, and a MER value evaluation estimation unit 503 are provided in place of the supply current control unit 301, the gain control unit 302, and the MER value evaluation unit 303.

The MER value evaluation estimation unit 503 estimates, when the supply current control unit 501 changes the magnitude of a supply current, to what extent noise components influence on a desired component in the signal Si supplied from the tuner 100 to the demodulator 200. The estimation by the MER value evaluation estimation unit 503 is carried out based on a measured MER value for the demodulator 200.

Figure 10:
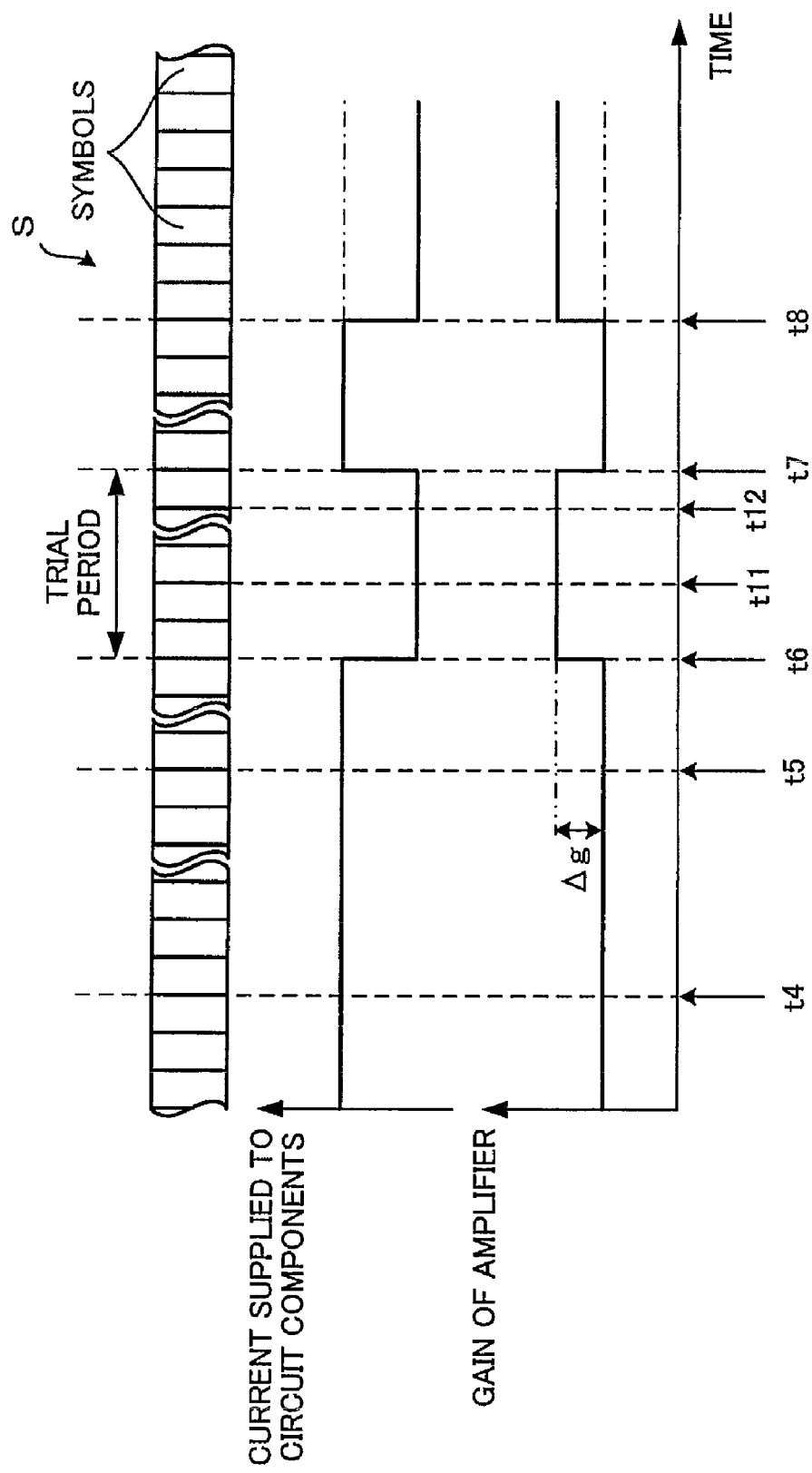
FIG. 10 is a timing chart showing changes in a supply current of a circuit component and changes in the gain of an amplifier unit when power-supply gain control is conducted in Second Embodiment.

In the present embodiment, the MER value evaluation estimation unit 503 performs the aforesaid estimation by tentatively changing the supply current and measuring the MER value after the tentative change. Among the two graphs in FIG. 10, the upper graph indicates temporal changes the supply current when the magnitude of the supply current to the circuit component is tentatively changed. In FIG. 10, the period between the time t6 and the time t7 is a trial period.

First, the MER value evaluation estimation unit 503 calculates an average of measured MER values supplied from the demodulator 200 during a period between t4 and t5 which period is before the trial period between t6 and t7. In other words, an average of the measured MER values before the supply current change is obtained as a reference value. The supply current control unit 501 then temporarily decreases the supply current to the circuit component at the time t6, and maintains the decreased supply current at this level until the time t7. At the time t7, the supply current control unit 501 returns the supply current to the magnitude before the trial period.

The MER value evaluation estimation unit 503 calculates an average of measured MER values supplied from the demodulator 200 during a period between t11 and t12 which period is encompassed in the trial period between t6 and t7. In other words, an average of measured MER values during a period in which the supply current is tentatively decreased is obtained. The time t11 at which the calculation of the average starts is arranged to be later than the time t6 at which the trial period starts, because, with this arrangement, when the aforesaid transition period or some kind of disturbances occur while the supply current is changed at the time t6, influences of such transition period and disturbances on the calculation of the average of the measured MER values are restrained.

After the time t7, the MER value evaluation estimation unit 503 compares the average of the measured MER values during the period between t4 and t5 with the average of the measured MER values during the period between t11 and t12. When the former is larger than the latter, it is indicated that the receiving state after the tentative supply current change is bad or maintained as it is in comparison with the receiving state before the tentative supply current change. The MER value evaluation estimation unit 503 therefore estimates that the receiving state does not improve in spite of supply current change, when the average of the measured MER values in the period between t4 and t5 is higher than the average of the measured MER values in the period between t11 and t12.

On the other hand, when the average of the measured MER values in the period between t4 and t5 is lower than the average of the measured MER values in the period between t11 and t12, it is indicated that the receiving state will improve after a tentative change in the supply current. The MER value evaluation estimation unit 503 therefore estimates that supply current change will improve the receiving state, when the average of the measured MER values in the period between t4 and t5 is lower than the average of the measured MER values in the period between t11 and t12.

Based on the estimation by the MER value evaluation estimation unit 503, the supply current control unit 501 controls the magnitude of the supply current at the time t8. More specifically, when the MER value evaluation estimation unit 503 estimates that supply current change will improve the receiving state, the supply current control unit 501 decreases, at the time t8, the supply current for the same amount as the amount of tentatively decrease in the supply current at the time t6. On the other hand, when the MER value evaluation estimation unit 503 estimates that supply current change will not improve the receiving state, the supply current control unit 501 maintains at the time t8 the magnitude of the supply current as it is.

In the upper graph of FIG. 10, the full lines indicate a case where the magnitude of the supply current is changed at the time t8, whereas the dashed lines indicate a case where the magnitude of the supply current is maintained as it is at the time t8. As such, how noise components influence on a desired component are actually estimated based on a measured MER value after the tentative change in supply current, and hence it is possible to surely estimate changes in the influences of the noise components in response to the changes in the supply current. Furthermore, since the supply current control is performed based on the estimation result, it is possible to perform the supply current control with proper considerations of the influences of noise components.

While the supply current control is performed as above, the gain control unit 302 changes the gain of either the RF amplifier unit 101 or the IF amplifier unit 105 at the same time as the supply current control unit 301 changes the magnitude of the supply current. In other words, the gain control unit 302 determines an amount of gain change Δg along with the determination of the gain control target, with reference to Tables 1 and 2 above. Then the gain control unit 302 changes the gain of either the RF amplifier unit 101 or the IF amplifier unit 105 in such a way as to cancel out the change in the gain of the circuit component caused by the supply current change. Such gain control is, as shown in the lower graph of FIG. 10, carried out at the times t6, t7, and t8 at each of which the supply current is controlled.

It is noted that the times t6, t7, and t8 at which supply current control and/or gain control are performed are preferably in sync with the leading ends of symbols as shown in FIG. 10. This makes it possible to minimize the influences of supply current change and/or gain change on the signal S, in the same manner as First Embodiment.

It is noted that the present embodiment also assumes an ideal case where a change in the supply current by the supply current control unit 501 and a change in the gain by the gain control unit 502 simultaneously start and these changes are finished immediately after the start. However, when it is expected that a transition period and/or disturbances occur at the time of supply current change and/or gain change, the timing of supply current change and the timing of gain change may be arranged to be within a temporal range equivalent to a single symbol in the same manner as First Embodiment.

When the present embodiment includes an automatic gain controller 400, the gain of the tuner 100 is controlled so that the automatic gain controller 400 returns the intensity of the output signal Si supplied from the tuner 100 to the original level, even if the gain control unit 502 does not change the gain. However, as discussed above, it takes time to return the intensity of the entire tuner 100 to the original level as above, because the automatic gain controller 400 gradually changes the gain. Accordingly, when the gain is continuously changed under the control of the automatic gain controller 400 within the trial period, the measured MER values obtained in the trial period may be inappropriate as the basis for the tentative change.

In the meanwhile, in the present embodiment, the gain control unit 502 changes the gain at the same time as the supply current control unit 501 changes the supply current. Because of this arrangement, the automatic gain controller 400 does not frequently change the gain of the tuner 100 during the trial period, and hence the gain of the entire tuner 100 is likely to be constant in the trial period. This allows for proper use of the measured MER values obtained in the trial period for the tentative change.

In the present embodiment, the supply current to the circuit component, which has been changed at the time t6, is tentatively returned to the original level at the time t7. Alternatively, the supply current changed at the time t7 may be maintained as it is, without being returned to the original level. For example, before the time t7, the MER value evaluation estimation unit 503 estimates whether the receiving state will improve. If the MER value evaluation estimation unit 503 estimates that the receiving state will improve, the supply current is maintained as it is at the time t7. On the other hand, if the MER value evaluation estimation unit 503 estimates that the receiving state will deteriorate, the supply current is returned to the original level at the time t7.

Alternatively, the estimation of the receiving state is not performed until the time t7, and the supply current is maintained as it is at the time t7. Subsequently, after the time t7, the MER value evaluation estimation unit 503 estimates whether the receiving state will improve. If the MER value evaluation estimation unit 503 estimates that the receiving state will improve, the supply current is maintained as it is. On the other hand, if the MER value evaluation estimation unit 503 estimates that the receiving state will deteriorate, the supply current is returned to the original level as soon as possible.

[Third Embodiment]

The following will now describe Third Embodiment which is a further embodiment of the present invention.

Figure 11:
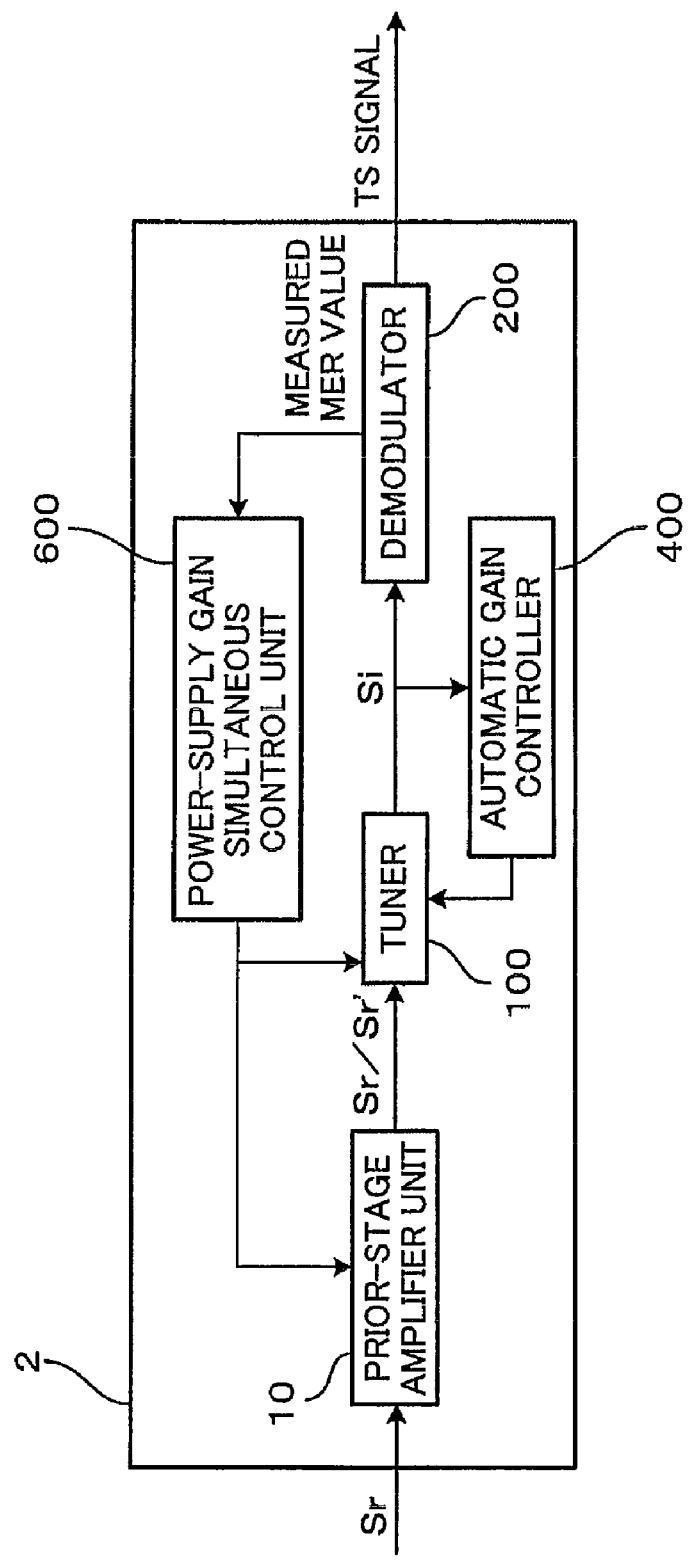
FIG. 11 is a block diagram of a digital demodulating apparatus of Third Embodiment which is a further embodiment of the present invention.

FIG. 11 is a block diagram of a digital demodulating apparatus 2 of Third Embodiment. This digital demodulating apparatus 2 is different from the digital demodulating apparatus 1 in that a prior-stage amplifier unit 10 is provided on the stage prior to the tuner 100 and a power-supply gain simultaneous control unit 600 controls both the prior-stage amplifier unit 10 and the amplifier units of the tuner 100. In the digital demodulating apparatus 2, a received signal Sr is input to the prior-stage amplifier unit 10.

Figure 12:
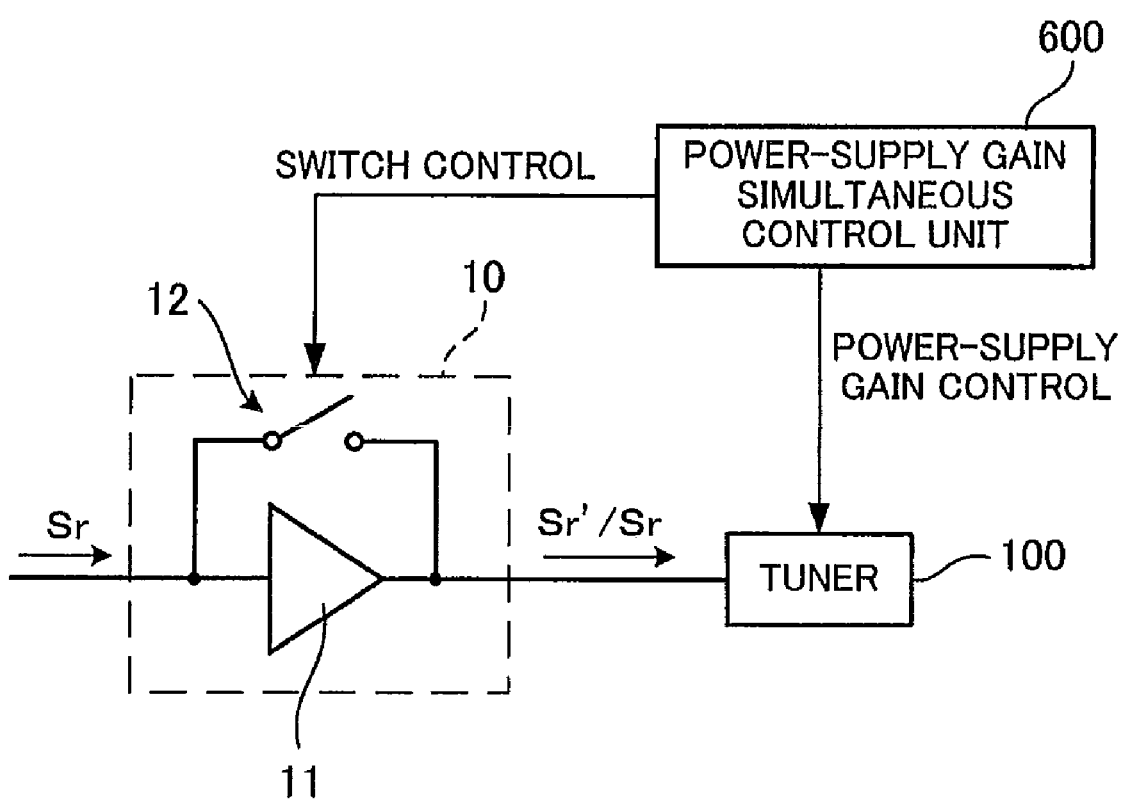
FIG. 12 is a block diagram of the prior-stage amplifier unit of FIG. 11 and its surroundings.

FIG. 12 shows the prior-stage amplifier unit 10. The prior-stage amplifier unit 10 includes an amplifier 11 and a switch 12. The switch 12 allows for the selection between an amp-on state in which the signal Sr is supplied to the amplifier 11 and an amp-off state in which the signal Sr is directly input to the tuner 100 without the intervention of the amplifier 11. The state of the switch 12 is switched over by the switch control performed by the power-supply gain simultaneous control unit 600. In the amp-on state, the amplifier 11 amplifies the signal Sr and outputs the amplified signal Sr' to the tuner 100. The amplifier 11 has a fixed amplification factor.

The power-supply gain simultaneous control unit 600 controls the supply currents and gains of circuit components in the tuner 100 in the same manner as First and Second Embodiments. In addition, the unit 600 performs the switch control of the prior-stage amplifier unit 10. When the switch 12 is controlled to be in the amp-on state, the signal Sr' which is produced by amplifying the signal Sr with the predetermined amplification factor is supplied to the tuner 100. On the other hand, when the switch 12 is switched from the amp-on state to the amp-off state, the signal Sr is directly input to the tuner 100 and the power consumption of the prior-stage amplifier unit 10 is reduced. However, when the prior-stage amplifier unit 10 is in the amp-off state, the overall gain of the prior-stage amplifier unit 10 and the tuner 100 becomes small as compared to the amp-on state.

In consideration of this, the power-supply gain simultaneous control unit 600 increases the gain of at least one of the RF amplifier unit 101 and the IF amplifier unit 105 of the tuner 100, at the same time as the prior-stage amplifier unit 10 is switched from the amp-on state to the amp-off state. On the contrary, when the prior-stage amplifier unit 10 is switched from the amp-off state to the amp-on state, the gain of at least one of the RF amplifier unit 101 and the IF amplifier unit 105 of the tuner 100 is decreased at the same time as the switch 12 is switched. In this way, the power-supply gain simultaneous control unit 600 controls the gains of the prior-stage amplifier unit 10 and the tuner 100 without changing the entire gain thereof.

In the meanwhile, the magnitude of noise components in a signal input to the demodulator 200 varies in accordance with the switching of the state of the prior-stage amplifier unit 10. For example, an interference wave noise generated from a circuit depends on the magnitude of an interference wave component included in a signal input to that circuit, as described above. For this reason, how much the amplification circuit on the stage prior to the aforesaid circuit amplifies the signal decides the magnitude of the interference wave noise of the circuit. In the meanwhile, other types of noise generated in a circuit are more or less constant regardless of the magnitude of the input signal to that circuit. Therefore, the larger the input signal to the circuit is, the smaller the relative intensity of other types of noise generated in that circuit is as compared to the intensity of the output signal.

In other words, an influence of other types of noise generated in each circuit component of the tuner 100 is relatively reduced in such a way that the prior-stage amplifier unit 10 is switched to the amp-on state and the signal Sr' produced by amplifying the signal Sr is input to the tuner 100. In the meanwhile, when the signal Sr includes an interference wave, the tuner 100 receives a signal Sr' including the amplified interference wave as the prior-stage amplifier unit 10 amplifies the signal Sr. As a result, an influence of interference wave noise in each circuit component of the tuner 100 increases.

When the signal Sr includes an interference wave, the prior-stage amplifier unit 10 is switched to the amp-off state and the signal Sr is directly input to the tuner 100. With this, an influence of interference wave noise in each circuit component of the tuner 100 is reduced as compared to the case where the prior-stage amplifier unit 10 is in the amp-on state. Furthermore, since the prior-stage amplifier unit 10 is switched to the amp-off state, it is possible to prevent interference wave noise from being generated in the amplifier 11 of the prior-stage amplifier unit 10.

To achieve this, the power-supply gain simultaneous control unit 600 measures the magnitude of the interference wave included in the received signal Sr received by the digital demodulating apparatus 2, based on the measured MER value supplied from the demodulator 200. When it is determined that the interference wave in the signal Sr is relatively large, the prior-stage amplifier unit 10 is switched to the amp-off state. On the other hand, when it is determined that the interference wave in the signal Sr is relatively small, the prior-stage amplifier unit 10 is switched to the amp-on state. When the state of the prior-stage amplifier unit 10 is switched, as discussed above, the gain of at least one of the RF amplifier unit 101 and the IF amplifier unit 105 of the tuner 100 is changed at the same time as the switching.

Figure 13:
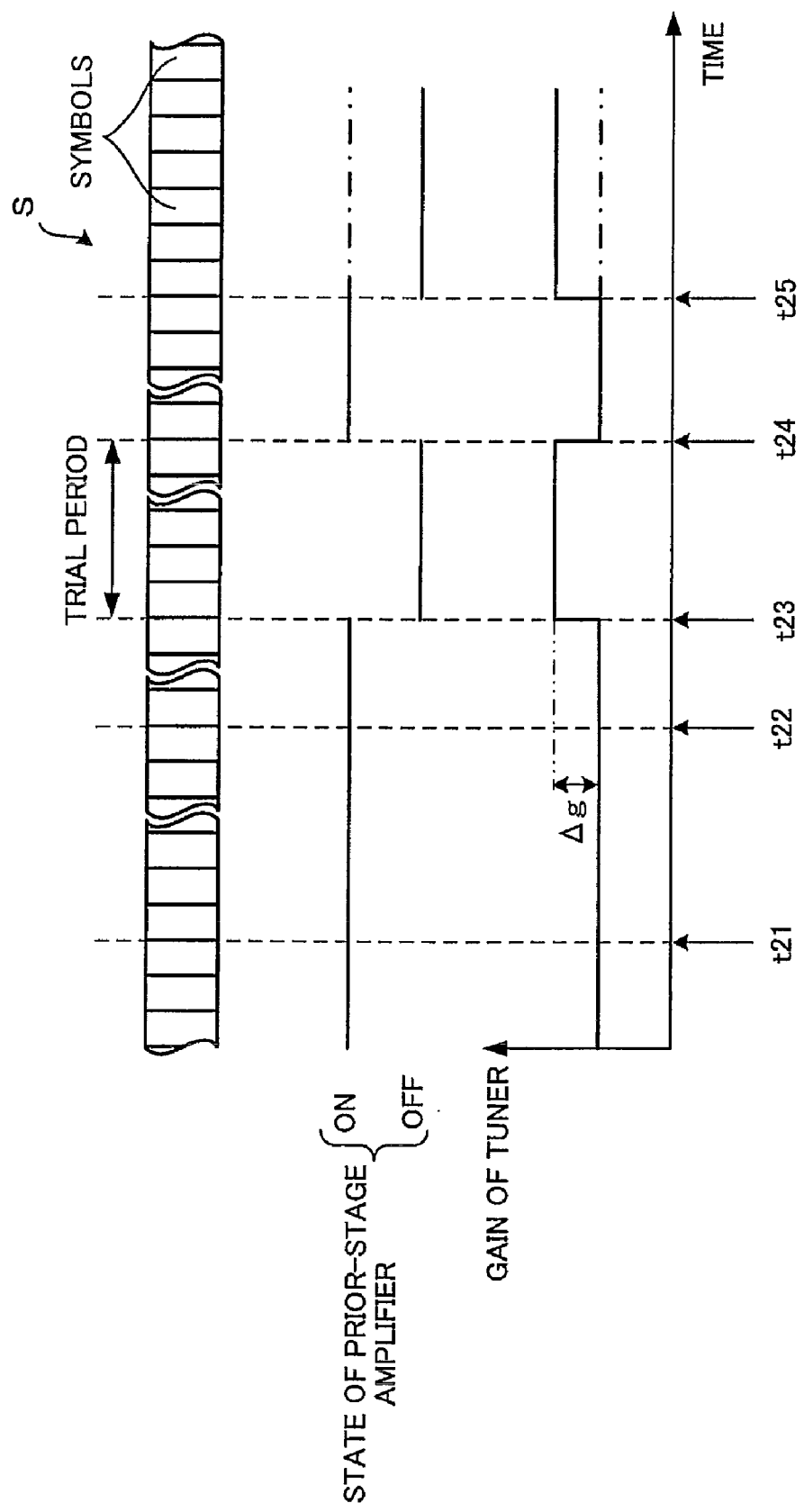
FIG. 13 is a timing chart showing changes in the state of the prior-stage amplifier unit and changes in the gain of the tuner when power-supply gain control is conducted in Third Embodiment.

Now, the control by the power-supply gain simultaneous control unit 600 will be further detailed. FIG. 13 is a timing chart showing the state of the prior-stage amplifier unit 10 and changes in the gain of the tuner 100. It is noted that FIG. 13 shows, as an example, a case where the prior-stage amplifier unit 10 is currently in the amp-on state.

First, the power-supply gain simultaneous control unit 600 calculates an average of the measured MER values during the period between the times t21 and t22. Subsequently, the prior-stage amplifier unit 10 is switched to the amp-off state at the time t23, and this state is maintained until the time t24. In the meanwhile, the average of the measured MER values is calculated during the period between t23 and t24. Then the amp-on state is reinstated at the time t24.

In the meanwhile, the power-supply gain simultaneous control unit 600 changes, at the time t23, the gain of the amplifier stage of the tuner 100 in such a way as to increase the gain for the same amount as the decrease Δg of the gain due to the switching of the prior-stage amplifier unit 10. Also at the time t24, the power-supply gain simultaneous control unit 600 changes the gain of the amplifier unit of the tuner 100 in such a way as to reduce the gain for the same amount as the increase Δg of the gain due to the switching of the prior-stage amplifier unit 10.

After the time t24, the power-supply gain simultaneous control unit 600 compares the average of the measured MER values during the period between the times t21 and t22 with the average of the measured MER values during the period between the times t23 and t24. If the latter is larger than the former, it is determined that the receiving state will be improved by switching the prior-stage amplifier unit 10. If the latter is smaller than the former, it is determined that the receiving state will not be improved by switching the prior-stage amplifier unit 10.

When it has been determined that the receiving state will be improved, the power-supply gain simultaneous control unit 600 switches the prior-stage amplifier unit 10 to the amp-off state at the time t25 and increases the gain of the tuner 100 by Δg (full line in FIG. 13). On the other hand, if it has been determined that the receiving state will not be improved, the amp-on sate of the prior-stage amplifier unit 10 is maintained at the time t25 and the gain of the tuner 100 is also maintained (dashed line in FIG. 13).

In the same manner as First and Second Embodiments, the present embodiment is preferably arranged so that the times t23, t24, and t25, which are the timings at which the state of the prior-stage amplifier unit 10 is switched and the gain is controlled in the tuner 100, are in sync with the leading ends of the symbols as shown in FIG. 13.

In the present embodiment, the state of the amplifier which has been changed at the time t23 is temporarily returned to the original state at the time t24. Alternatively, in the same manner as Second Embodiment, the state of the amplifier after the change may be maintained without reinstating the original state at the time t24.

As described above, the present embodiment is arranged so that an influence of interference wave noise is assessed in such a way that the state of the prior-stage amplifier unit 10 is tentatively switched and the average of the measured MER values before the change is compared with the average of the measured MER values after the change. For example, when the influence of the noise components becomes significant after the prior-stage amplifier unit 10 is switched to the amp-off state, it is determined that the interference wave in the received signal Sr is relatively large. On the contrary, when the influence of the noise components becomes less significant after the prior-stage amplifier unit 10 is switched to the amp-on state, it is determined that the interference wave in the received signal Sr is relatively small. Based on the determination above, the state of the prior-stage amplifier unit 10 is properly controlled.

<Other Variations>

While illustrative and presently preferred embodiments of the present invention have been described in detail herein, it is to be understood that the inventive concepts may be otherwise variously embodied and employed within the scope of the invention.

For example, the embodiments above assume that an amplifier unit is provided inside the tuner 100 or in the stage prior to the tuner 100 and the gain of this amplifier unit is changed. Alternatively, the present invention may be arranged so that an attenuator is provided in the tuner 100 or in the stage prior to the tuner 100 and the gain of this attenuator is changed.

In addition to the above, the embodiments above assume that, when a current supplied to a circuit component is decreased, the gain of this circuit component is also decreased. Alternatively, it is possible to adopt a circuit component whose gain is increased as the supply current thereto is decreased. In this case, the gain of the entire tuner 100 is maintained as it is in such a way that the gain of the amplifier unit is decreased as the supply current to the circuit component is decreased.

In addition to the above, the embodiments above assume that a supply current to a circuit component is changed. The present invention, however, is not limited to current control. The present invention can be used in any arrangements in which the gain of a circuit component changes as the supply current thereto changes. For example, the present invention may be adopted in an arrangement in which voltage supply to a circuit component changes as a supply current to the circuit component changes, so that the gain of this circuit component is changed.

In addition to the above, the embodiments above assume that the timing at which the supply current is changed and the timing at which the gain is changed preferably fall within the temporal range equivalent to a single symbol and the timing at which the supply current is changed is preferably in sync with the leading end of a single symbol. In the present invention, it is further preferable that the timing to change the supply current and the timing to change the gain fall within the range of the guard interval of a single symbol. This is because, when the aforesaid timings fall within the range of the guard interval, the changes in the supply current and gain do not easily influence on the valid part of the single symbol even if they influence on the signal.

In addition to the above, First and Second Embodiments above assume that the gain control unit changes the gain of either the RF amplifier unit 101 or the IF amplifier unit 105. Alternatively, the gain control unit may simultaneously change the gains of the both units.

In addition to the above, Second and Third Embodiments assume that the trial period is set across plural symbols. Regarding this, the number of symbols influenced by the trial period is preferably as small as possible. It is therefore preferable that the trial period is not longer than a single symbol. In addition to the above, in the embodiments above, the MER measurement outside the trial period is performed before the trial period. Alternatively, the measurement may be performed after the trial period.

In addition to the above, in Second Embodiment the supply current is decreased at the start of the trial period. Alternatively, the supply current may be increased at the start of the trial period. Similarly, in Third Embodiment, the prior-stage amplifier unit 10 is switched from the amp-on state to the amp-off state at the start of the trial period. Alternatively, the prior-stage amplifier unit 10 may be switched from the amp-off state to the amp-on state at the start of the trial period. This makes it possible to evaluate an influence of noise components when the supply current is increased or when the prior-stage amplifier unit 10 is switched from the amp-off state to the amp-on state.

In addition to the above, Second and Third Embodiments teach that how an influence of noise components on a desired component is changed is evaluated by tentatively changing, in the trial period, the supply current to the circuit component or changing the state of the prior-stage amplifier unit 10. Alternatively, an influence of noise components may be evaluated in a different manner. For example, the demodulator 200 includes means for estimating, based on a variation in the measured MER value or the like, the magnitude of an interference wave in the received signal of the portable communications device 1000, and how an influence of noise components changes is evaluated based on the estimated magnitude of interference wave. This is because, when the interference wave is large, it is estimated that an influence of interference wave noise on the output signal Si of the tuner 100 will be restrained in such a way that the supply current to the RF amplifier unit 101 is decreased so that the gain of the RF amplifier unit 101 is decreased and/or the prior-stage amplifier unit 10 is switched to the amp-off state.

In addition to the above, the embodiments above are arranged such that an influence of noise components is evaluated based on the MER values measured by the waveform equalizing unit 205. Alternatively, an influence of noise components may be evaluated based on BER values calculated by the error correction unit 206. Also, an influence of noise components may be evaluated by a method different from the calculation of MER values and the calculation of the BER values.

In addition to the above, the present invention may be arranged as in the case of PLC such that, in tuning means performing the tuning process of the present embodiment, the tuner 100 shown in FIG. 2 is constituted either solely by the filter unit 104 or by the filter unit 104 and the amplifier unit 105, and the frequency band limiting of the signal Sr input to the tuner 100 is carried out.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. A digital demodulating apparatus comprising:
   plural circuit components constituting a tuning unit which performs a tuning process on a received signal and an intensity changing unit which changes the intensity of the received signal;
   a demodulator which performs a demodulating process on the signal which has been subjected to the tuning process by the tuning unit and whose intensity has been changed by the intensity changing unit;

a power changing unit which changes the magnitude of power supplied to the circuit components; and a gain changing unit which changes a gain when the intensity changing unit changes the intensity of the received signal, wherein, the intensity changing unit includes a variable-gain circuit whose gain is variable, the gain changing unit changes the gain of the variable-gain circuit by a predetermined amount substantially at the same time as the power changing unit changes the power supplied to the circuit components, and the predetermined amount is arranged so that an overall gain of the circuit components is unchanged before and after changing the power and the gain by the power changing unit and the gain changing unit.

2. The digital demodulating apparatus according to claim 1, further comprising:

a noise evaluation unit which evaluates an influence of a noise component on a desired component in a signal received by the demodulator, wherein, the power changing unit changes the magnitude of the power supplied to the circuit components, based on a result of evaluation by the noise evaluation unit.

3. The digital demodulating apparatus according to claim 1, wherein, the noise evaluation unit estimates how an influence of the noise component on the desired component in the signal received by the demodulator changes before and after the power changing unit changes the magnitude of the power supplied to the circuit components, and the power changing unit changes the magnitude of the power supplied to the circuit components based on a result of estimation by the noise evaluation unit.

4. The digital demodulating apparatus according to claim 3, wherein, the power changing unit changes the power supplied to the circuit components from a first value to a second value, at a timing to start a predetermined trial period, substantially at the same time as the timing to start the predetermined trial period, the gain changing unit changes the gain of the variable-gain circuit by a first gain value as the predetermined amount, with which value the overall gain of the circuit components is unchanged, and the noise evaluation unit compares an influence of the noise component on the desired component within the predetermined trial period with an influence of the noise component on the desired component outside the predetermined trial period.

5. The digital demodulating apparatus according to claim 4, wherein, the power changing unit changes the power supplied to the circuit components from the second value to the first value at a timing to end the predetermined trial period, and substantially at the same time as the timing to end the predetermined trial period, the gain changing unit changes the gain of the variable-gain circuit by a second gain value as the predetermined amount, with which value the overall gain of the circuit components is unchanged.

6. The digital demodulating apparatus according to claim 1, wherein, the power changing unit changes the magnitude of the power supplied to the variable-gain circuit, and substantially at the same time as the power changing unit changes the magnitude of the power supplied to the variable-gain circuit, the gain changing unit changes the gain of the variable-gain circuit whose power supply has been changed by the power changing unit.

7. The digital demodulating apparatus according to claim 1, wherein, the received signal is constituted by a signal sequence in which plural unit signals are lined up in time series, and a timing at which the power changing unit changes the power supplied to the circuit components and a timing at which the gain changing unit changes the gain of the variable-gain circuit fall within a temporal range equivalent to one of the unit signals.

8. The digital demodulating apparatus according to claim 7, wherein, the power changing unit changes the power supplied to the circuit components at a timing of the leading end of one of the unit signals, and the gain changing unit changes the gain of the variable-gain circuit at a timing falling within said one of the unit signals.

9. A digital demodulating apparatus comprising:

plural circuit components constituting a tuning unit which performs a tuning process on a received signal and an intensity changing unit which changes the intensity of the received signal;

a demodulator which performs a demodulating process on the signal which has been subjected to the tuning process by the tuning unit and whose intensity has been changed by the intensity changing unit;

a power changing unit which changes the magnitude of power supplied to the circuit components; and a gain changing unit which changes a gain when the intensity changing unit changes the intensity of the received signal, wherein, the intensity changing unit includes a variable-gain circuit whose gain is variable, the gain changing unit changes the gain of the variable-gain circuit by a predetermined amount substantially at the same time as the power changing unit changes the power supplied to the circuit components, the predetermined amount is arranged so that an overall gain of the circuit components is unchanged before and after changing the power and the gain by the power changing unit and the gain changing unit, and based on the signal which has been subjected to the demodulating process by the demodulator, at least one of text data, image data, and audio data is reconstructed.

10. A method of controlling a digital demodulating apparatus which includes: plural circuit components constituting a tuning unit which performs a tuning process on a received signal and an intensity changing unit which changes the intensity of the received signal; a demodulator which performs a demodulating process on the signal which has been subjected to the tuning process by the tuning unit and whose intensity has been changed by the intensity changing unit; a power changing unit which changes the magnitude of power supplied to the circuit components; and a gain changing unit which changes a gain when the intensity changing unit changes the intensity of the received signal, the intensity changing unit including a variable-gain circuit whose gain is variable, the method comprising the steps of:

(i) changing the magnitude of the power supplied to the circuit components; and (ii) changing a gain when the intensity changing unit changes the intensity of the received signal, wherein, in the step (ii), substantially at the same time as the step (i), the gain of the variable-gain circuit is changed in such a way that an overall gain of the circuit components is unchanged before and after both of the steps (i) and (ii) are carried out.

11. A non-transitory computer-readable recording medium storing a computer program for a digital demodulating apparatus which includes: plural circuit components constituting a tuning unit which performs a tuning process on a received signal and an intensity changing unit which changes the intensity of the received signal; a demodulator which performs a demodulating process on the signal which has been subjected to the tuning process by the tuning unit and whose intensity has been changed by the intensity changing unit; a power changing unit which changes the magnitude of power supplied to the circuit components; and a gain changing unit which changes a gain when the intensity changing unit changes the intensity of the received signal, the intensity changing unit including a variable-gain circuit whose gain is variable, wherein, the computer program when executed causes the digital demodulating apparatus to substantially simultaneously perform the steps of: (i) changing the magnitude of the power supplied to the circuit components; and (ii) changing a gain when the intensity changing unit changes the intensity of the received signal, in such a way that an overall gain of the circuit components is unchanged before and after both of the steps (i) and (ii) are carried out.

* * * * *